(12) United States Patent
David et al.

(10) Patent No.: US 10,084,121 B2
(45) Date of Patent: Sep. 25, 2018

(54) SMALL LED SOURCE WITH HIGH BRIGHTNESS AND HIGH EFFICIENCY

(71) Applicant: SORAA, INC., Fremont, CA (US)

(72) Inventors: Aurelien J. F. David, San Francisco, CA (US); Rafael Aldaz, Pleasanton, CA (US); Michael Ragan Krames, Mountain View, CA (US); Frank M. Steranka, San Jose, CA (US); Kevin Huang, Fremont, CA (US); Troy Trottier, San Jose, CA (US)

(73) Assignee: Soraa, Inc., Fremont, CA (US)

(*) Notice: Subject to any disclaimer, the term of this patent is extended or adjusted under 35 U.S.C. 154(b) by 0 days.

(21) Appl. No.: 15/661,515

(22) Filed: Jul. 27, 2017

(65) Prior Publication Data

US 2017/0324010 A1 Nov. 9, 2017

Related U.S. Application Data

(63) Continuation of application No. 15/236,898, filed on Aug. 15, 2016, which is a continuation of application No. 14/528,818, filed on Oct. 30, 2014, now Pat. No. 9,419,189.

(60) Provisional application No. 61/899,723, filed on Nov. 4, 2013.

(51) Int. Cl.
 *H01L 33/50* (2010.01)
 *H01L 33/46* (2010.01)
 *H01L 33/32* (2010.01)

(52) U.S. Cl.
 CPC .......... *H01L 33/508* (2013.01); *H01L 33/32* (2013.01); *H01L 33/46* (2013.01)

(58) Field of Classification Search
 CPC ........ H01L 33/508; H01L 33/32; H01L 33/46
 USPC .......................................................... 257/98
 See application file for complete search history.

(56) References Cited

U.S. PATENT DOCUMENTS

2011/0018017 A1* 1/2011 Bierhuizen ............. H01L 33/46
 257/98
2012/0043552 A1* 2/2012 David ................ C09K 11/0883
 257/76

\* cited by examiner

*Primary Examiner* — Fernando L Toledo
*Assistant Examiner* — Adam S Bowen
(74) *Attorney, Agent, or Firm* — FisherBroyles, LLP

(57) ABSTRACT

Small LED sources with high brightness and high efficiency apparatus including the small LED sources and methods of using the small LED sources are disclosed.

20 Claims, 32 Drawing Sheets

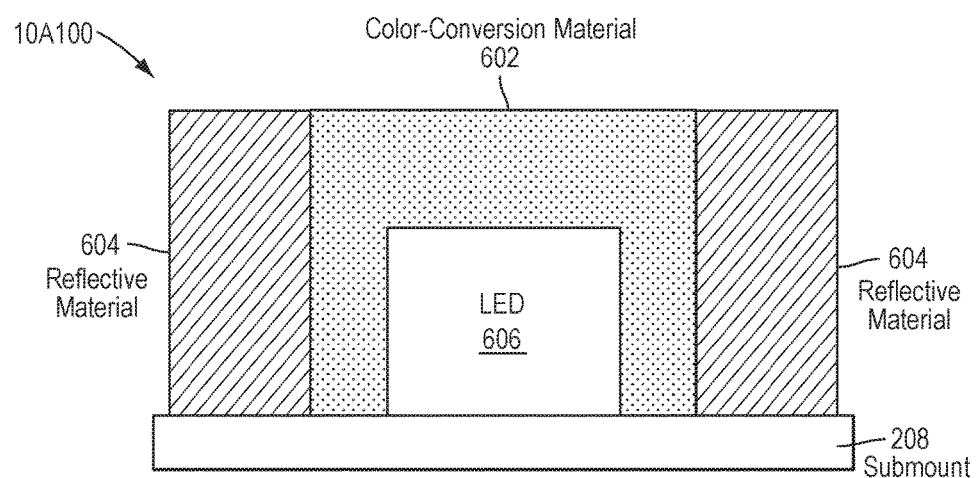
FIG. 10A1
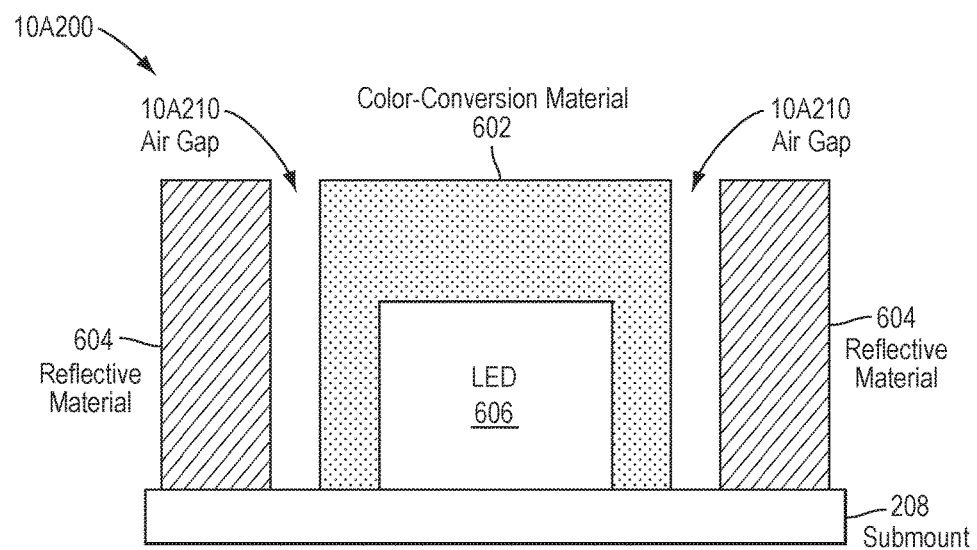
FIG. 10A2

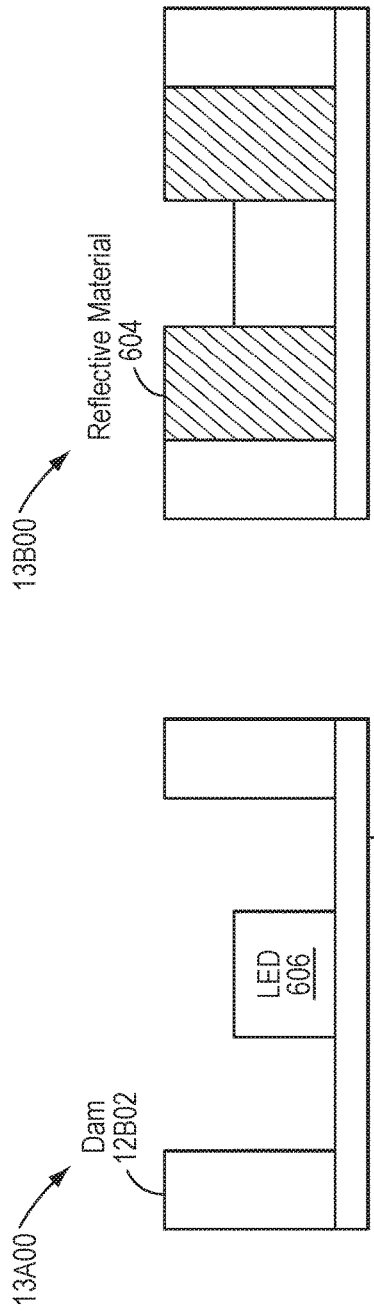
FIG. 13A
FIG. 13B
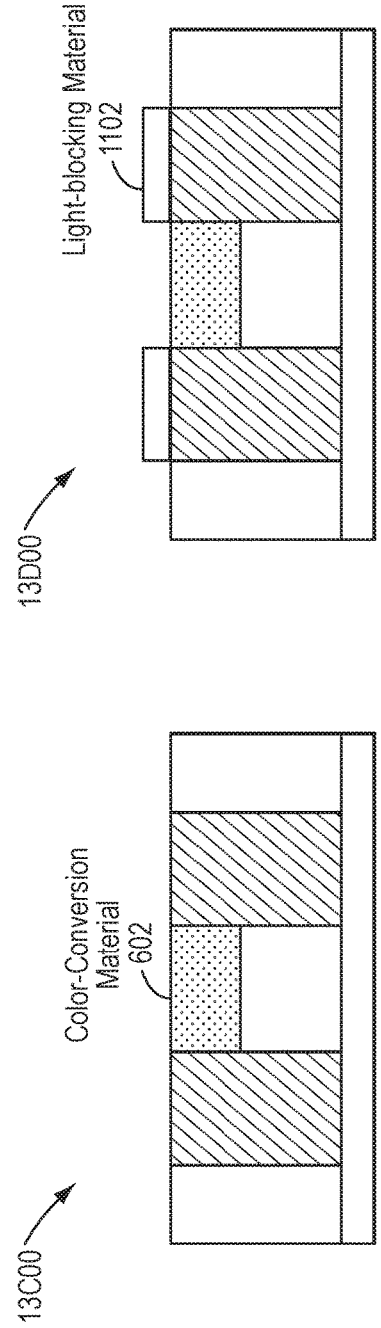
FIG. 13C
FIG. 13D

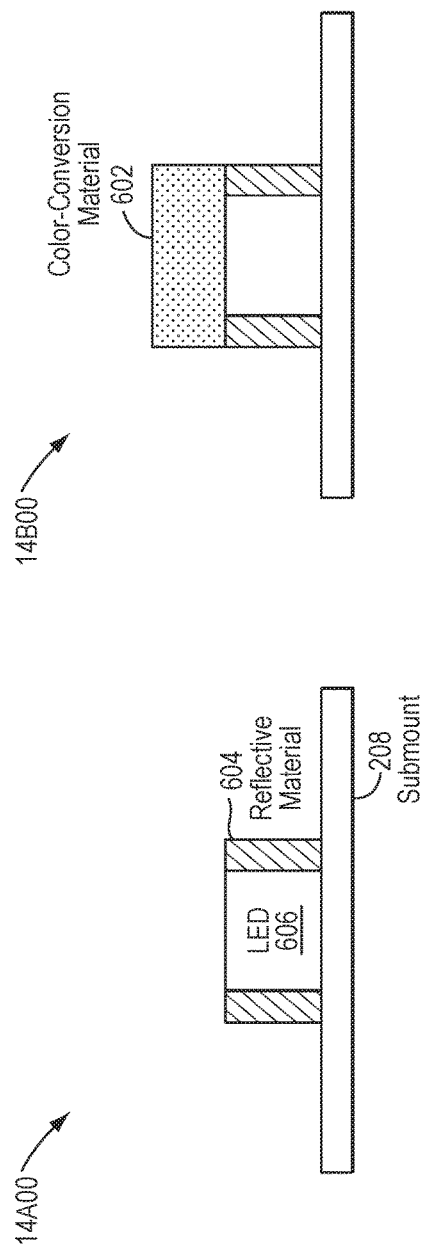
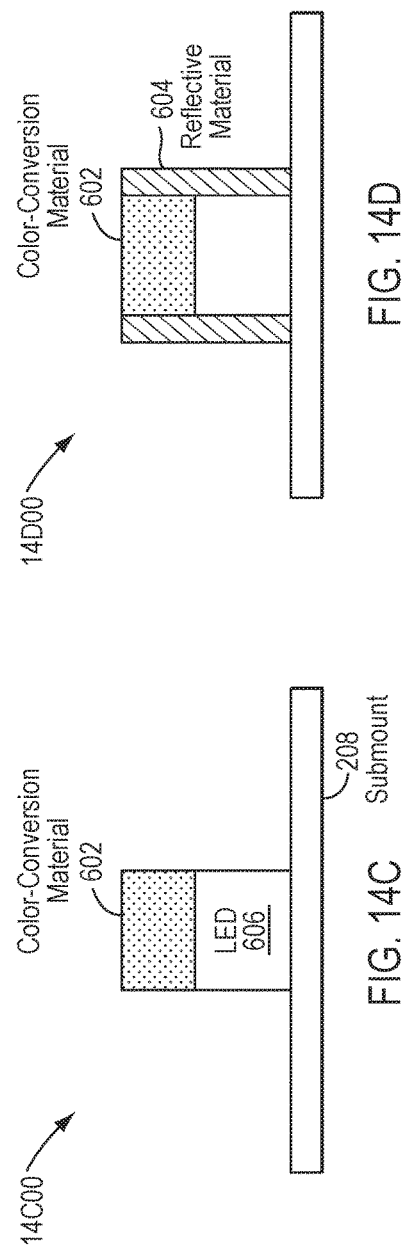

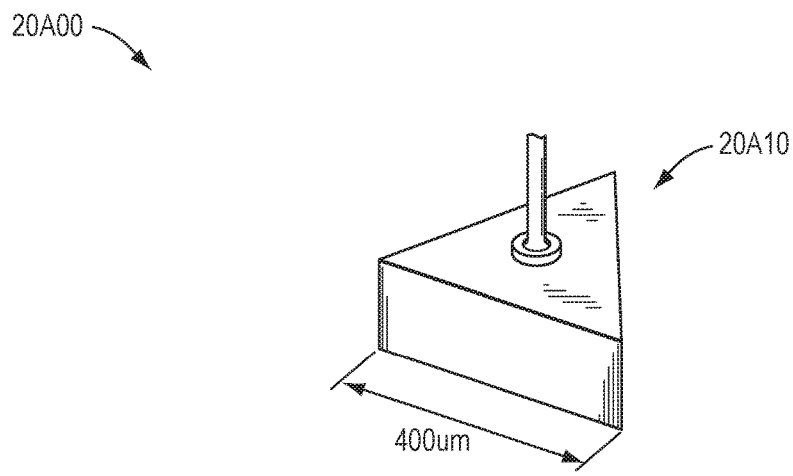
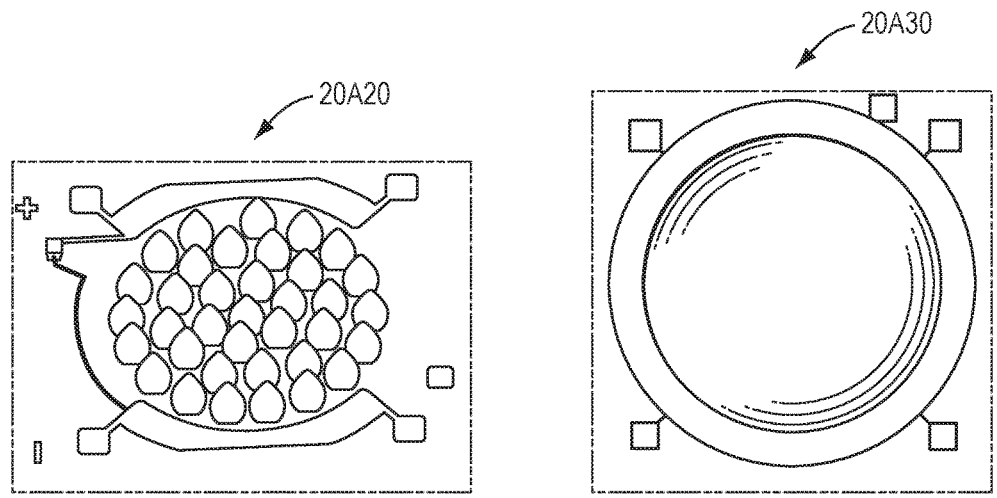
FIG. 20A1
FIG. 20A2  FIG. 20A3

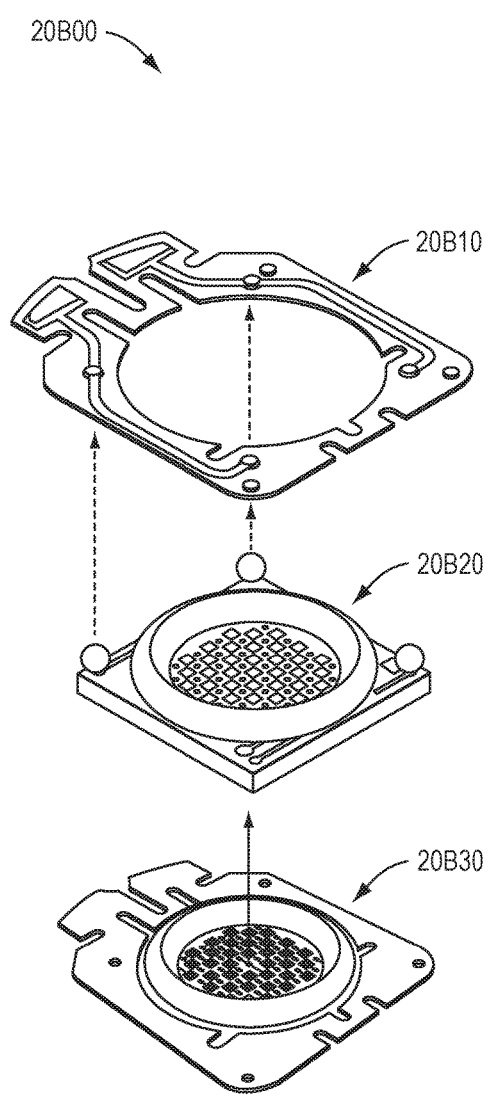
FIG. 20B1
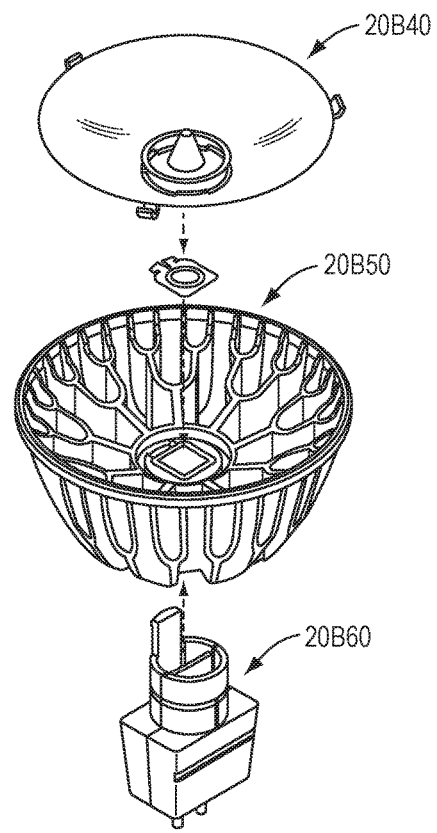
FIG. 20B2
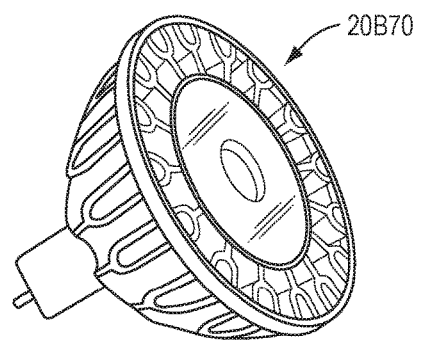
FIG. 20B3

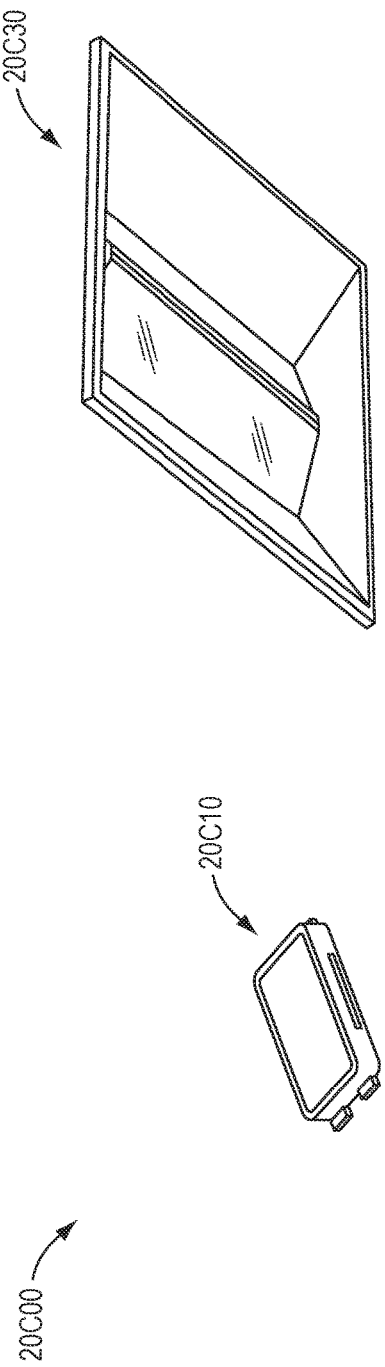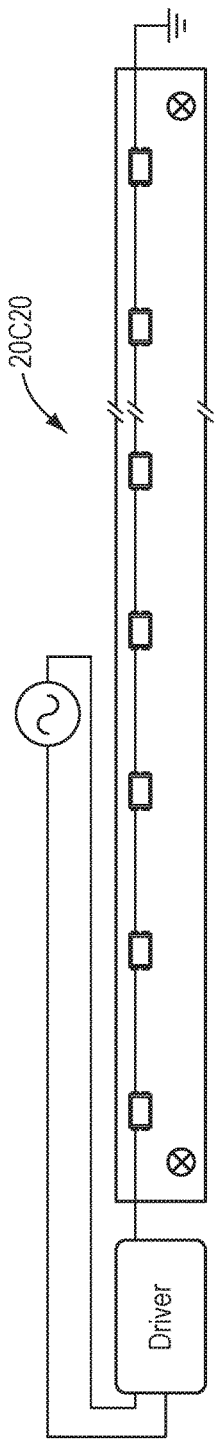

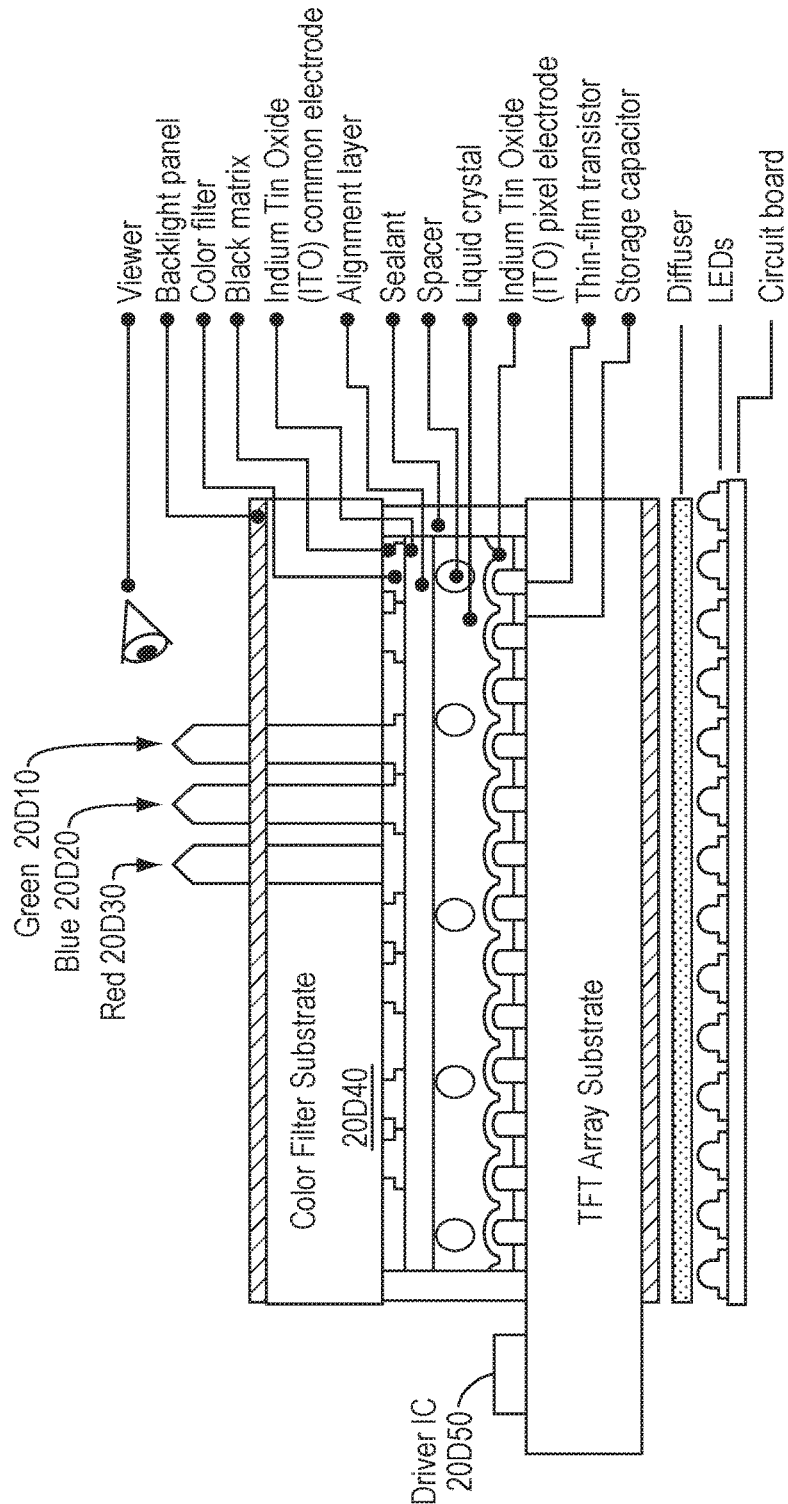
FIG. 20D1

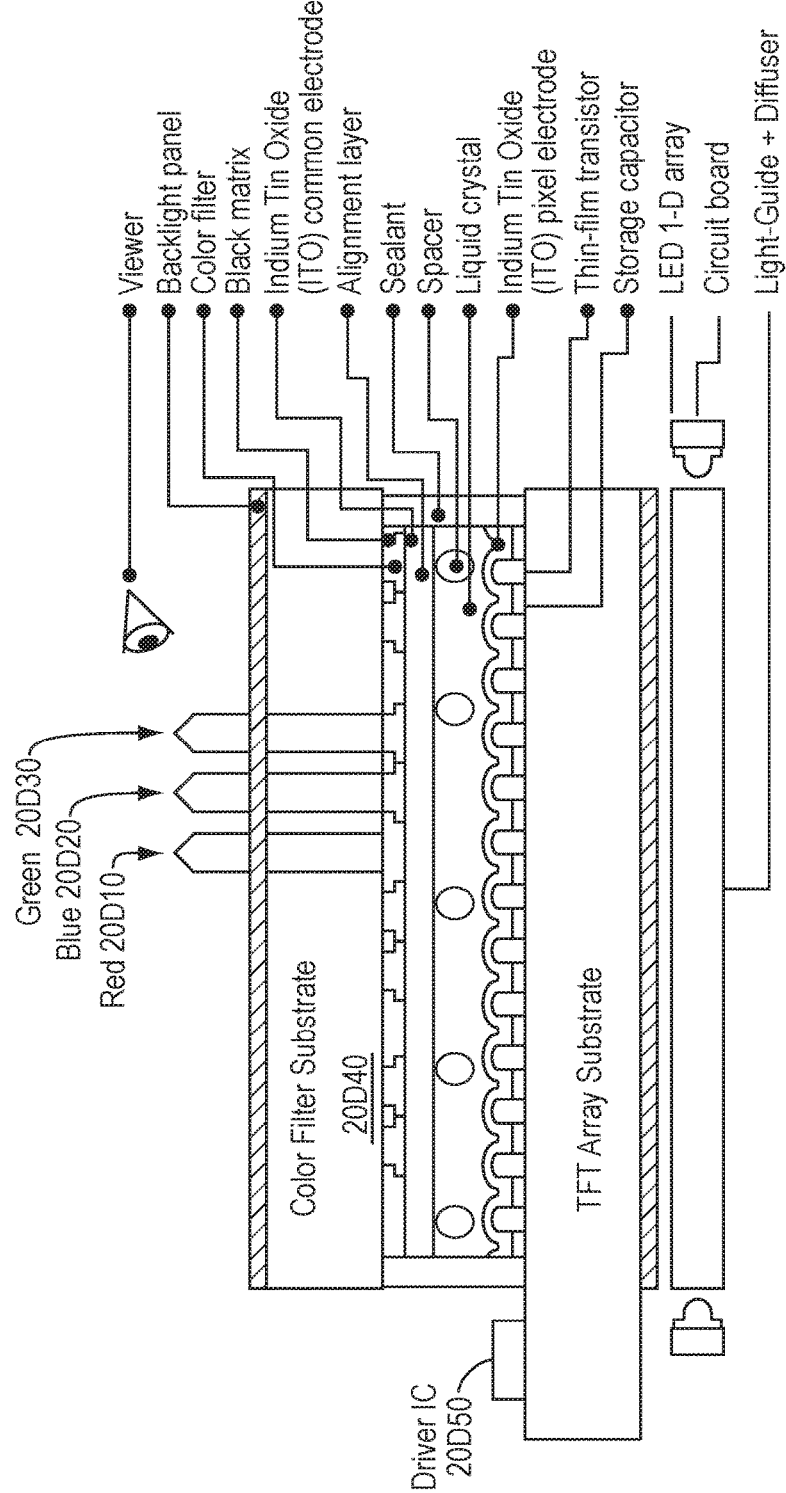
FIG. 20D2

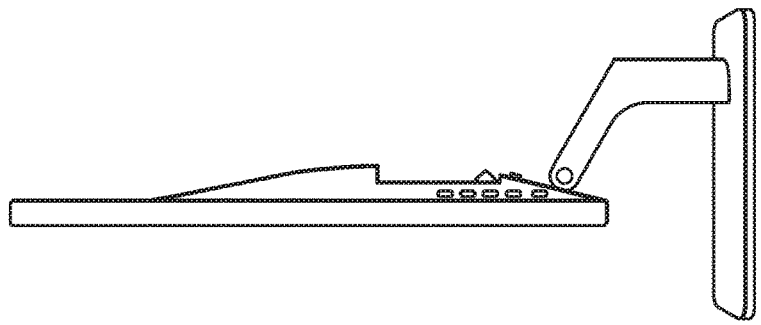
FIG. 20E2
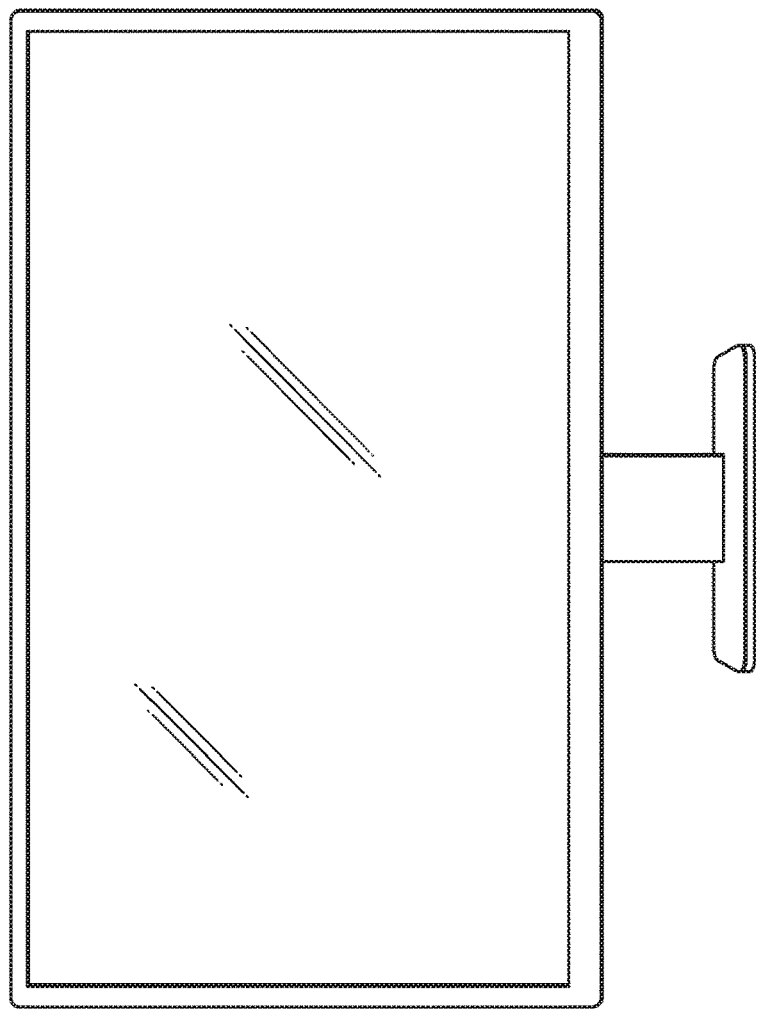
FIG. 20E1

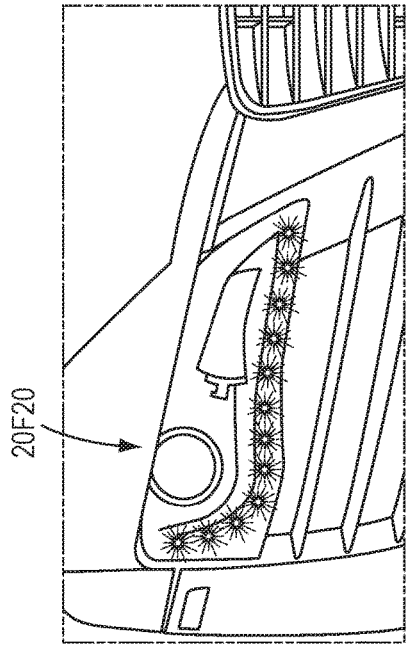
FIG. 20F1
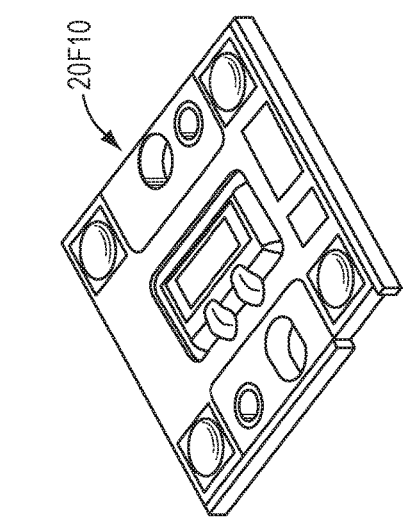
FIG. 20F2
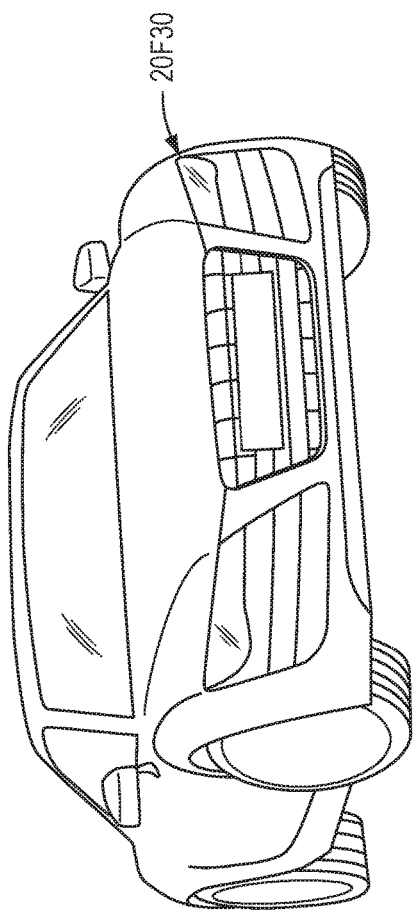
FIG. 20F3

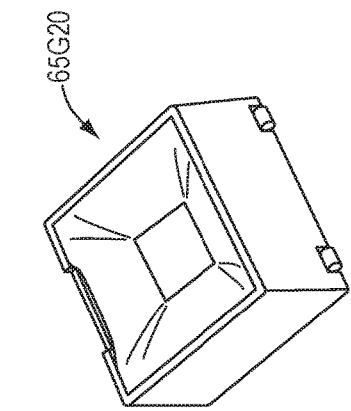
FIG. 20G2
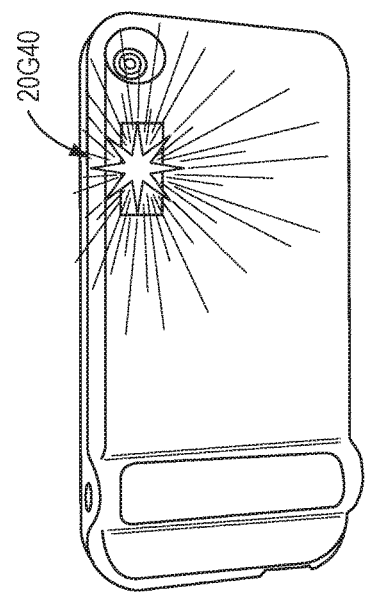
FIG. 20G4
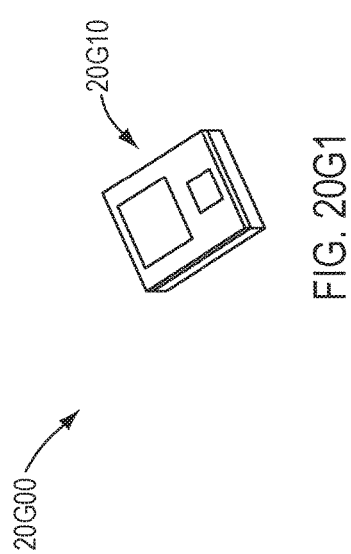
FIG. 20G1
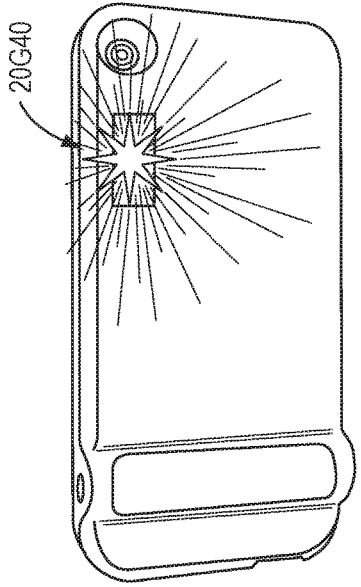
FIG. 20G3 to use the small LED sources.
SMALL LED SOURCE WITH HIGH BRIGHTNESS AND HIGH EFFICIENCY This application is a continuation of U.S. application Ser. No. 15/236,898 filed on Aug. 15, 2016, which was a continuation of U.S. application Ser. No. 14/528,818 filed on Oct. 30, 2014, which claims the benefit under 35 U.S.C. § 119(e) of U.S. Provisional Application No. 61/899,723, filed on Nov. 4, 2013, each of which is incorporated by reference in its entirety.

FIELD

The disclosure relates to the field of LED-based illumination products and more particularly to small LED sources with high brightness and high efficiency and methods for using the small LED sources.

BACKGROUND

The typical footprint of a high-brightness white LED is around 1×1 mm² (such as those used in automotive forward lighting or camera flash applications); however, white LED sources with a small footprint, high surface brightness, and high efficiency are desirable for certain applications such as when they are employed as light sources for displays. For example, high brightness enables efficient coupling to display waveguides and smaller optics or no optics. Likewise, a small footprint helps reduce the size of the optics and the thickness of a display system. It is also desirable that the LED's surface be flat rather than dome-shaped, to improve system optical efficiency.

Contemporary literature has discussed how small sources below 300 μm² can be desirable for display applications; however, only monochromatic sources are proposed. White sources require a color-conversion element for white-light generation, which makes their miniaturization challenging.

Therefore, what is needed is an LED source that has a small surface area, and emits a sufficient optical power from substantially one surface with a sufficient efficiency.

This may be achieved in at least two ways:
1. Using a low-droop device architecture which can be driven to a very high current density while maintaining sufficient efficiency; and
2. Designing the electrode scheme such that a large enough fraction of the footprint is used for light generation.

Embodiments of the disclosure may use either of these approaches, or combine them. Below are described embodiments following these approaches.

SUMMARY

Disclosed herein are methods and devices. One of the disclosed devices comprises a light-emitting diode having a base area less than 250 μm×250 μm; and an emitting surface having an area configured to emit substantially white light. The emitting surface is characterized by a surface brightness of 800 mW/mm² or more and at least 80% of the base area is used for light generation. In certain embodiments, a footprint of about 200 μm×200 μm is achieved.

BRIEF DESCRIPTION OF THE DRAWINGS

Those skilled in the art will understand that the drawings, described herein, are for illustration purposes only. The drawings are not intended to limit the scope of the present disclosure.

FIG. 10A1 and FIG. 10A2 depict an LED surrounded by color-conversion materials as used in designs for a small LED source with high brightness and high efficiency, according to some embodiments.

FIGS. 13A-13D depict LED cross-sections during a series of fabrication steps where an LED is placed on the submount and a dam material is placed around the small LED source with high brightness and high efficiency, according to fabrication of some embodiments.

FIGS. 14A-14D depict LED cross-sections during a series of fabrication steps where an LED is placed on the submount and a thin reflector is formed on the sides of the small LED source with high brightness and high efficiency, according to fabrication of some embodiments.

FIGS. 20A1-20I depict examples of uses for the disclosed small LED source with high brightness and high efficiency, according to some embodiments.

DETAILED DESCRIPTION

Figure 1:
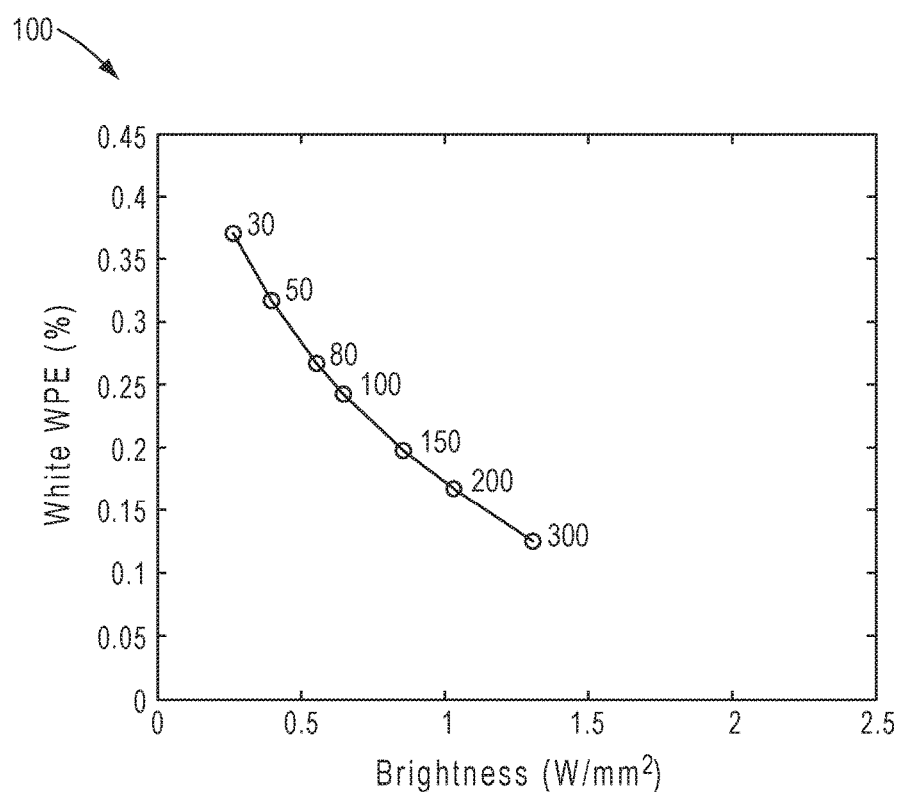
FIG. 1 shows a tradeoff curve illustrating problems to be addressed when designing a small LED source with high brightness and high efficiency.

In many applications, it is desirable that an LED source have a surface brightness of at least 800 mW/mm$^2$. Assuming an operating white-light wall-plug efficiency of about 20%, such an LED should be driven at a power of about 160 mW and a current density of about 130 A/cm$^2$ to emit a sufficient amount of light. What is needed is an LED source that has a small surface area, and emits a sufficient optical power from substantially one surface with a sufficient efficiency.

What follows are definitions, descriptions of materials used in the embodiments, and a detailed discussion of the figures.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. In addition, the articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

The term "area" describes the total area of an object and is not tied to a specific shape. For example, and object of dimensions 100×100 μm$^2$ and an object of dimensions 10×1000 μm$^2$ have the same area, and can be characterized by "an area of 100×100 μm$^2$". In other words, an object having dimensions of 100×100 μm$^2$ includes an object having an area of 10,000 μm$^2$. Furthermore, an object having dimensions less than 100×100 μm$^2$ includes objects in which one of the dimensions is less than 100 μm and objects in which both dimensions are less than 100 μm such as, for example, 50×100 μm$^2$ and 50×50 μm$^2$. Also, an object having dimensions less than 100×100 μm$^2$ includes objects having an area less than 10,000 μm$^2$ such as, for example, 1,000 μm$^2$ and 100 μm$^2$. Similar definitions apply to objects having dimensions greater than the indicated dimensions. The areas may be square, rectangular, trapezoidal, circular, oval, or any other suitable shape.

The compositions of phosphors or other wavelength-converting materials referred to in the present disclosure comprise any uses of or combinations of various wavelength-converting materials.

Wavelength conversion materials can be crystalline (single or poly), ceramic or semiconductor particle phosphors, ceramic or semiconductor plate phosphors, organic or inorganic downconverters, upconverters (anti-stokes), nanoparticles and other materials which provide wavelength conversion. Major classes of downconverter phosphors used in solid-state lighting include garnets doped at least with $Ce^{3+}$; nitridosilicates or oxynitridosilicates doped at least with $Ce^{3+}$; chalcogenides doped at least with $Ce^{3+}$; silicates or fluorosilicates doped at least with $Eu^{2+}$; nitridosilicates, oxynitridosilicates or sialons doped at least with $Eu^{2+}$; carbidonitridosilicates or carbidooxynitridosilicates doped at least with $Eu^{2+}$; aluminates doped at least with $Eu^{2+}$; phosphates or apatites doped at least with $Eu^{2+}$; chalcogenides doped at least with $Eu^{2+}$; and oxides, oxyfluorides or complex fluorides doped at least with $Mn^{4+}$. Some specific examples are listed below:

$(Ba,Sr,Ca,Mg)_5(PO_4)_3(Cl,F,Br,OH):Eu^{2+}, Mn^{2+}$
$(Ca,Sr,Ba)_3MgSi_2O_8:Eu^{2+}, Mn^{2+}$
$(Ba,Sr,Ca)MgAl_{10}O_{17}:Eu^{2+}, Mn^{2+}$
$(Na,K,Rb,Cs)_2[(Si,Ge,Ti,Zr,Hf,Sn)F_6]:Mn^{4+}$
$(Mg,Ca,Zr,Ba,Zn)[(Si,Ge,Ti,Zr,Hf,Sn)F_6]:Mn^{4+}$
$(Mg,Ca,Sr,Ba,Zn)_2SiO_4:Eu^{2+}$
$(Sr,Ca,Ba)(Al,Ga)_2S_4:Eu^{2+}$
$(Ca,Sr)S:Eu^{2+},Ce^{3+}$
$(Y,Gd,Tb,La,Sm,Pr,Lu)_3(Sc,Al,Ga)_5O_{12}:Ce^{3+}$

The group:
$Ca_{1-8}Al_{x-xy}Si_{1-x+xy}N_{2-x-xy}C_{xy}:A$
$Ca_{1-x-z}Na_zM(III)_{x-xy-z}Si_{1-x+xy+z}N_{2-x-xy}C_{xy}:A$
$M(II)_{1-x-z}M(I)_zM(III)_{x-xy-z}Si_{1-x+xy+z}N_{2-x-xy}C_{xy}:A$
$M(II)_{1-x-z}M(I)_zM(III)_{x-xy-z}Si_{1-x+xy+z}N_{2-x-xy-2w/3}C_{xy}O_{w-v/2}H_v:A$
$M(II)_{1-x-z}M(I)_zM(III)_{x-xy-z}Si_{1-x+xy+z}N_{2-x-xy-2w/3-v/3}CxyO_wH_v:A$
wherein $0<x<1$, $0<y<1$, $0≤z<1$, $0≤v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.

$LaAl(Si_{6-z}Al_z)(N_{10-z}Oz):Ce^{3+}$ (wherein z=1)
$(Mg,Ca,Sr,Ma)(Y,Sc,Gd,Tb,La,Lu)_2S_4:Ce^{3+}$
$(Ba,Sr,Ca)_xxSi_yN_z:Eu^{2+}$ (where 2x+4y=3z)

$(Y,Sc,Lu,Gd)_{2-n}Ca_nSi_4N_{6+n}C_{1-n}:Ce^{3+}$, (wherein $0\leq n\leq 0.5$)
(Lu,Ca,Li,Mg,Y) α-SiAlON doped with $Eu^{2+}$ and/or $Ce^{3+}$
$(Ca,Sr,Ba)SiO_2N_2:Eu^{2+},Ce^{3+}$
$Sr,Ca)AlSiN_3:Eu^{2+}$
$CaAlSi(ON)_3:Eu^{2+}$
$(Y,La,Lu)Si_3N_5:Ce^{3+}$
$(La,Y,Lu)_3Si_6N_{11}:Ce^{3+}$ For purposes of the application, it is understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

Further, it is to be understood that nanoparticles, quantum dots, semiconductor particles, and other types of materials can be used as wavelength converting materials. The list above is representative and should not be taken to include all the materials that may be utilized within embodiments described herein.

The limitations found within devices resulting from legacy attempts present many opportunities for advancing the state of the art. For example, legacy blue-pumped thin-film white LEDs with high brightness have been demonstrated. Such 1 mm×1 mm chips at an injection current of 1 A have a brightness of about 700 mW/mm² and a wall plug efficiency (WPE) of about 23%. The brightness of these LEDs can be increased by driving them at higher current densities, however, this reduces the wall-plug efficiency. The reduction in efficiency at high current density is due to several effects, including at least droop in internal quantum efficiency, additional heating, and higher electrical losses at high current.

What is needed is an LED source that has a small surface area, and emits a sufficient optical power from substantially one surface with a sufficient efficiency. The appended figures and discussion thereto show how to make and use such LED sources.

FIG. 1 shows a tradeoff curve 100 illustrating problems to be addressed when designing a small light emitting diode (LED) source with high brightness and high efficiency.

FIG. 1 illustrates this tradeoff between efficiency and brightness. In FIG. 1, a state-of-the-art blue-pumped 1 mm² white LED is considered. This is a thin-film LED grown on a sapphire substrate. The LED is inserted into a system with a base temperature of 80° C. (representative of realistic display systems). The projected performance at various current densities is shown. At higher current density, brightness increases and WPE decreases. It should also be noted that reliable continuous operation of such LEDs on sapphire is usually restricted to 100 A/cm² and below.

For the device of FIG. 1 operated at 1A, the brightness and WPE performance are sufficient for display applications, however, the source size is too large. Upon shrinking the LED to a suitable footprint, the performance is negatively impacted by several effects, including:

A fixed part of the total LED footprint is used by the n-contacts.

No light generation occurs in this area which is typically 100 μm×100 μm or larger.

When the total LED area is reduced, this inactive area occupies a larger fraction of the total area. Therefore the active area is reduced, leading to worse efficiency droop.

Thermal and electrical resistance scale roughly inversely with the LED active area. Therefore, smaller devices have both increased electrical power losses and higher operating temperatures.

Figure 2A:
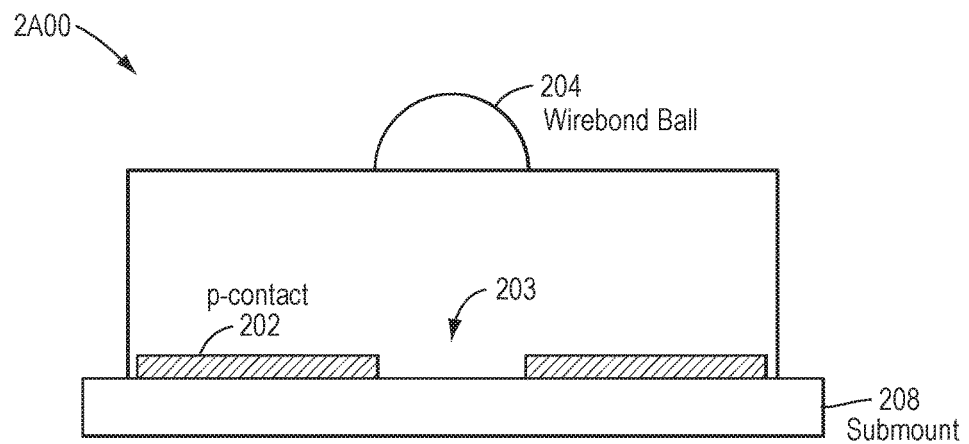
FIG. 2A is a cross-section view of a wirebond LED for discussing problems to be addressed when designing a small LED source with high brightness and high efficiency.

FIG. 2A shows a cross-section view of a wirebond LED 2A00 for discussing problems to be addressed when designing a small LED source with high brightness and high efficiency. The LED device shown in FIG. 2A includes LED 203, p-contact 202, submount 208, and wirebond ball 204.

Figure 2B:
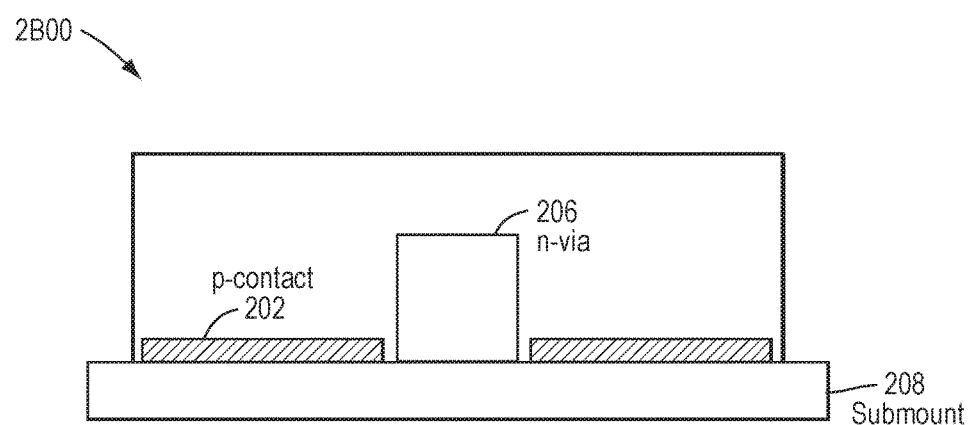
FIG. 2B is a cross-section view of a flip-chip LED for discussing problems to be addressed when designing a small LED source with high brightness and high efficiency.

Issues related to the n-contact footprint are illustrated in FIGS. 2A and 2B. In traditional LEDs (FIG. 2A), the n-electrode occupies a minimum size of about 100 μm² and above. In the case of vertical LEDs, the presence of an n-bond pad (e.g., see wirebond ball 204) that is used for wirebonding blocks light emitted from the active region of the LED. If one elects to emit light below the n-pad, a large fraction of the light is lost; therefore, light generation beneath the n-contact is often prevented by the introduction of a current-blocking area. A current-blocking area is an area where no current injection occurs (e.g., current-blocking area 203), and therefore no light is generated. This can, for example, be achieved by not forming a p-contact in that area—the p-contact may be replaced with an insulating dielectric layer.

FIG. 2B shows a cross-section view of a flip-chip LED 2B00 for discussing problems to be addressed when designing a small LED source with high brightness and high efficiency. The LED device shown in FIG. 2B includes submount 208, p-contact 202, and n-via 206, and shows a cross-section of LED devices in which the n-contact area occupies at least 100 μm².

In the case of flip-chip LEDs current-blocking areas are created by the presence of large n-vias that contact the n-type material from the bottom of the LED. A potentially large fraction of the p-contact can be lost to n-vias.

Figure 3:
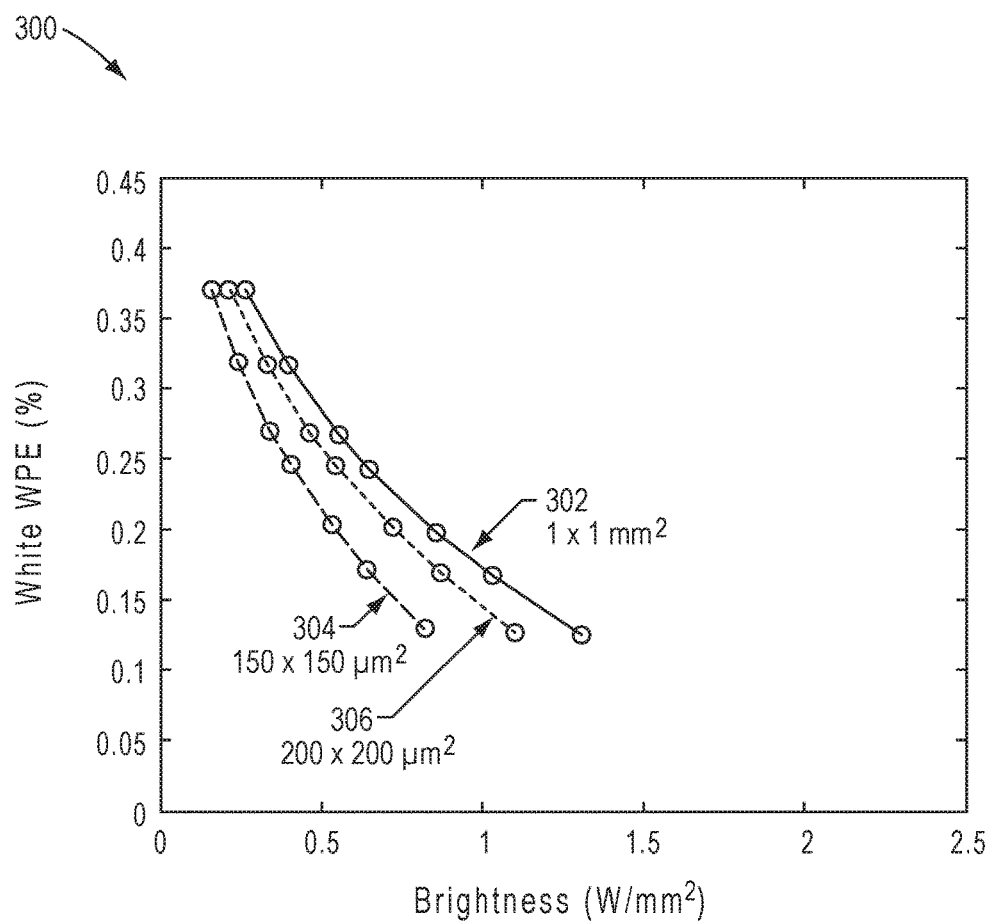
FIG. 3 shows a tradeoff curve of a blue-pumped thin-film design for depicting performance characteristics to be considered in the design of a small LED source with high brightness and high efficiency.

FIG. 3 shows a tradeoff curve 300 of a blue-pumped thin-film design for depicting performance characteristics to be considered in the design of a small LED source with high brightness and high efficiency.

FIG. 3 quantifies the impact that the above issues have on performance. FIG. 3 shows several LED footprints (e.g., 1 mm×1 mm 302, 150 μm×150 μm 304, 200 μm×200 μm 306, etc.). When the footprint is reduced from 1 mm×1 mm to 200 μm×200 μm and 150 μm×150 μm, performance is significantly reduced.

These issues and limitations are fundamental: as the footprint of a GaN-based LED becomes smaller, the loss of relative active area increases droop, and the electrical and thermal resistance also increase. This increased electrical and thermal resistance leads to a reduction in performance. What is needed is an LED source, which has a small surface area, and emits a sufficient optical power from substantially one surface with a sufficient efficiency. This may be achieved in various ways. As examples:

1. Using a low-droop device architecture that can be driven to a very high current density while maintaining sufficient efficiency.
2. Designing the electrode scheme such that a large enough fraction of the footprint is used for light generation (e.g., light is not prevented from escaping by the presence and juxtaposition of the electrode).

Embodiments of the disclosure may use either of these approaches, or combine them. Below are described embodiments following these approaches.

The low-droop approach employs LEDs with reduced efficiency loss at high current density. This is possible, according to some embodiments, through the use of violet-pump LEDs on a bulk III-nitride substrate. These LEDs may be grown on a polar, non-polar, or semi-polar plane, and may have any shape (e.g., having a base that is square, rectangular, polygonal or rectilinear, or circular or oblong, etc.).

Figure 4:
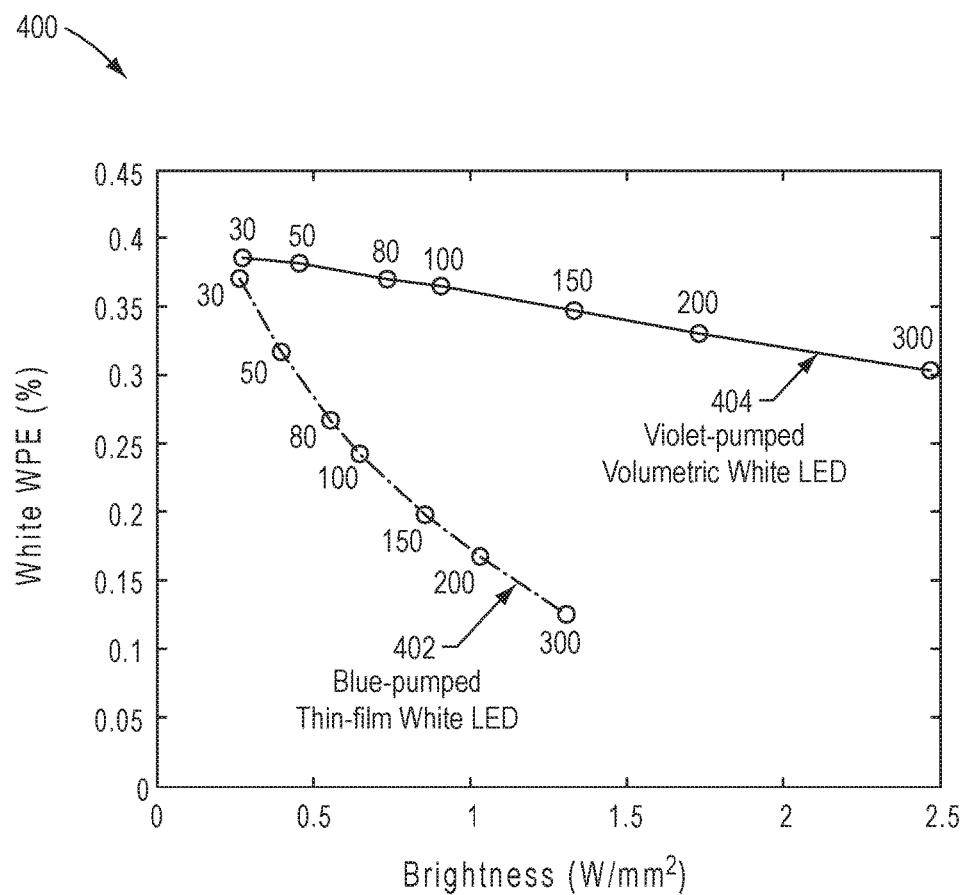
FIG. 4 shows a tradeoff curve of a violet-pumped volumetric LED for depicting performance characteristics to be considered in the design of a small LED source with high brightness and high efficiency.

FIG. 4 shows a tradeoff curve 400 of a violet-pumped volumetric LED for depicting performance characteristics to be considered in the design of a small LED source with high brightness and high efficiency. The numbers on the graph indicated the corresponding current density (A/cm$^2$).

FIG. 4 shows the performance of a violet-pumped volumetric white LED 404 grown on a bulk GaN substrate, with a footprint of 250 µm×250 µm. The 1 mm$^2$ blue-pumped thin film white LED 402 device of FIG. 1 is also shown for comparison. At a current density of 50 A/cm$^2$, the two devices have similar performance. However, at higher current density, the violet-pumped white LED maintains higher performance over a wide range of current density operation. This is due to its lower efficiency droop, and also to its lower electrical resistance, which is attributable at least in-part to the use of a bulk GaN substrate.

Figure 5:
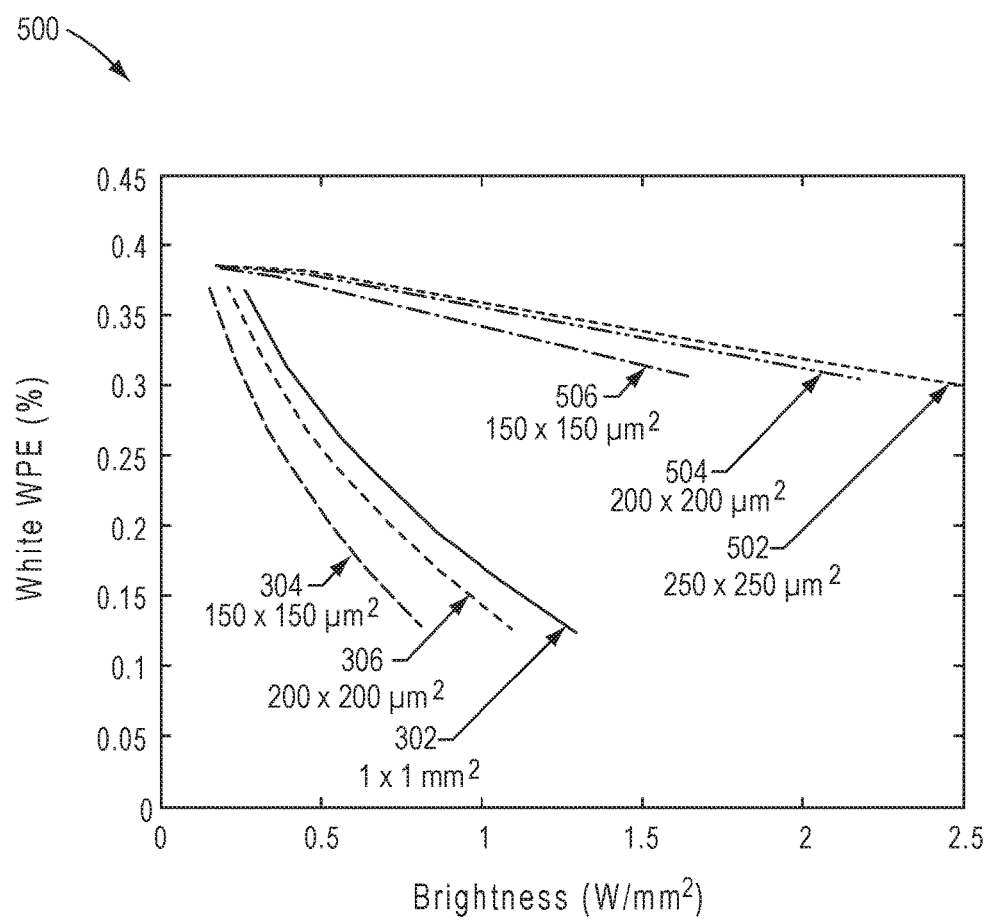
FIG. 5 is a tradeoff curve of a violet-pumped volumetric LED design for depicting how such LEDs maintain a high performance when their footprint is scaled down for designing a small LED source with high brightness and high efficiency.

FIG. 5 shows a tradeoff curve 500 of a violet-pumped white volumetric LED design for depicting how such LEDs maintain a high performance when the footprint is scaled down for producing a small LED source with high brightness and high efficiency.

FIG. 5 shows how such LEDs maintain a high performance when their footprint is scaled down. As shown, performance is only marginally affected over the range, due at least in part to the low droop and low electrical resistance of the devices. In addition, operation at high current density (200 A/cm$^2$ and greater) is reliable. Due to the presence of the bulk substrate, such LEDs are usually thick (100 µm to 200 µm) and emit light from all sides. In some cases, however, the LED may be thinner, for example, 50 µm thick or 10 µm thick, or thinner. In certain applications, (e.g., for display applications), it is preferred to use LEDs in a configuration such that white light is emitted only from or substantially from one surface.

The performance of many LED configurations are shown in FIG. 5, in particular corresponding to a footprint are of 250 µm×250 µm 502, 200 µm×200 µm 504, 150 µm×150 µm 506.

Embodiments of the invention are not limited to these footprints. For example, in some embodiments, the footprint is 10 µm×10 µm or 1 µm×1 µm.

Figure 6A:
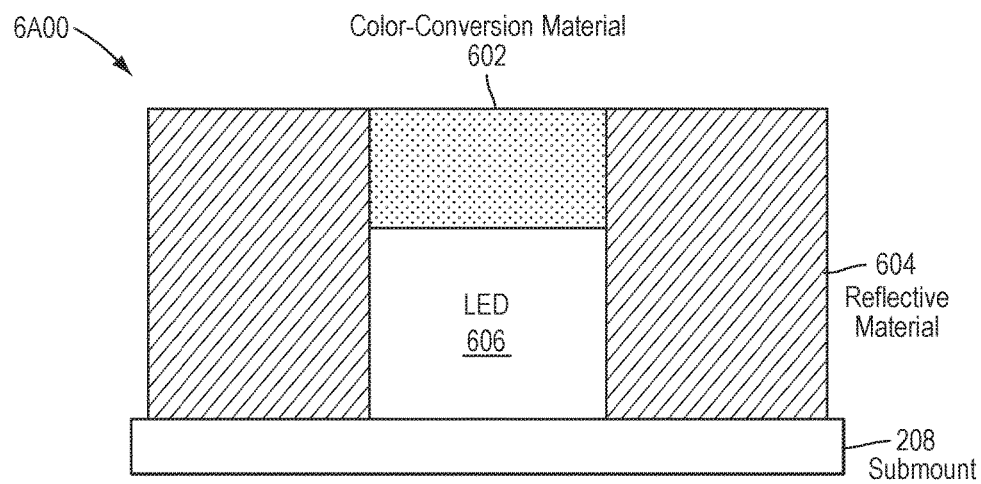
FIG. 6A depicts an LED source placed on a high-reflectivity submount as used in the design of a small LED source with high brightness and high efficiency, according to some embodiments.

FIG. 6A depicts an LED source 6A00 placed on a high-reflectivity submount as used in the design of a small LED source with high brightness and high efficiency.

As shown in the embodiment of FIG. 6A, the LED source is placed on a high-reflectivity submount 208. The top surface dimensions are 150 µm×150 µm. The sidewalls of the LED are covered by a reflective material 604. The top surface of the LED 606 is covered by a color-conversion material 602 such as a phosphor, with surface dimensions similar to that of the LED. Light is substantially emitted by the top surface of the color-conversion material. The sidewall reflective material 604 may be a diffuse reflector, such as a TiO$_2$-based reflector, a metallic mirror, a dichroic mirror, or a combination of these elements. In certain embodiments, the reflective material and/or the submount comprises a diffuse reflector, a metal material, a dielectric stack, or a combination of any of the foregoing.

In some embodiments, the use of a high-reflectivity submount can be advantageous to reduce optical loss and thus improve optical performance. In some cases, the reflectivity is high at the emission wavelength of the pump LED. In some cases, the reflectivity is high in a large range of angles and wavelengths (e.g. across the visible range) to reduce optical loss for converted light. In some embodiments, for example, reflectivity is higher than 80% (or higher than 90%, or higher than 95%) across the visible range and at all incident angles of light.

Figure 6B:
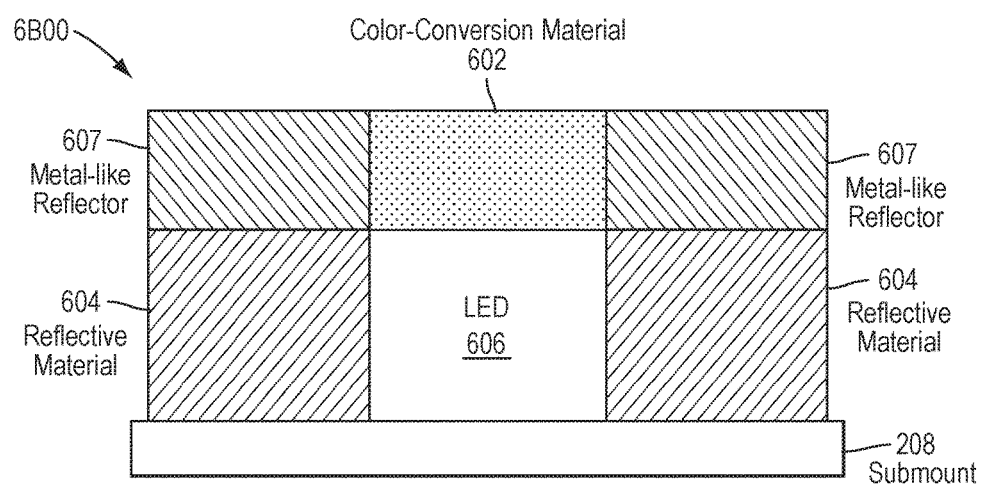
FIG. 6B depicts an LED source with a metal-like reflector as used in the design of a small LED source with high brightness and high efficiency, according to some embodiments.

FIG. 6B depicts an LED source 6B00 with a metal-like reflector as used in the design of a small LED source with high brightness and high efficiency.

In the embodiment of FIG. 6B, the LED source is covered on its sides with a first reflective material (e.g., reflective material 604) that is planar to the top of the LED. A second reflector 607, such as a metal reflector, with a small aperture filled with the color-conversion material 602 is then placed on top of the LED. The second reflector serves as a light blocking material and cavity for the color-conversion material.

Figure 7:
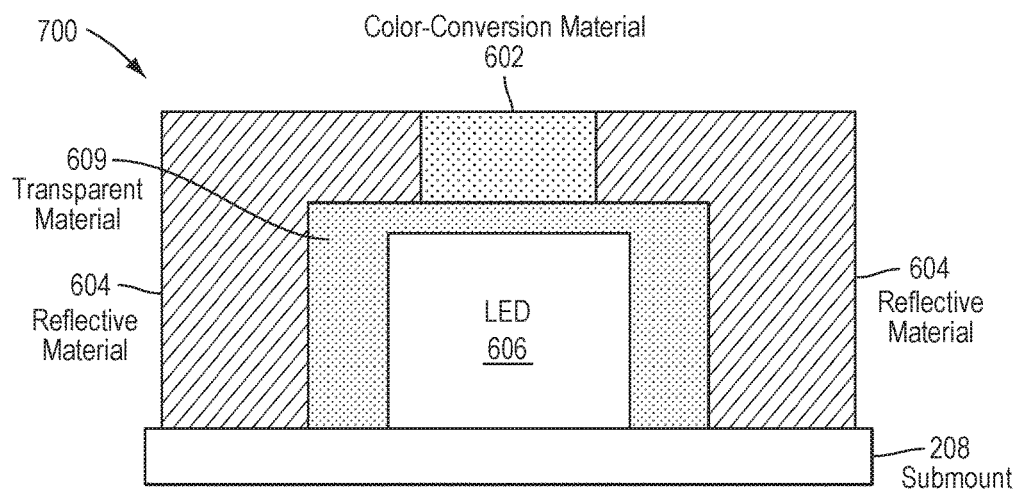
FIG. 7 depicts an LED surrounded by a transparent layer as used in designs for a small LED source with high brightness and high efficiency, according to some embodiments.

FIG. 7 depicts an LED 700 surrounded by a transparent layer as used in designs for a small LED source with high brightness and high efficiency.

In such embodiments as depicted in FIG. 7, the LED is surrounded by a transparent material 609 (e.g., as air or silicone). In one such embodiment, the transparent material 609 is located all around the LED. In another embodiment, the transparent material is located only on the sides of the LED. In another embodiment, the transparent material is located only on top of the LED. The embodiment further comprises a reflective material 604 in proximity to the LED and/or in proximity to the color conversion material. In some embodiments, an aperture is formed in the reflective material where the color conversion material is located.

Figure 8:
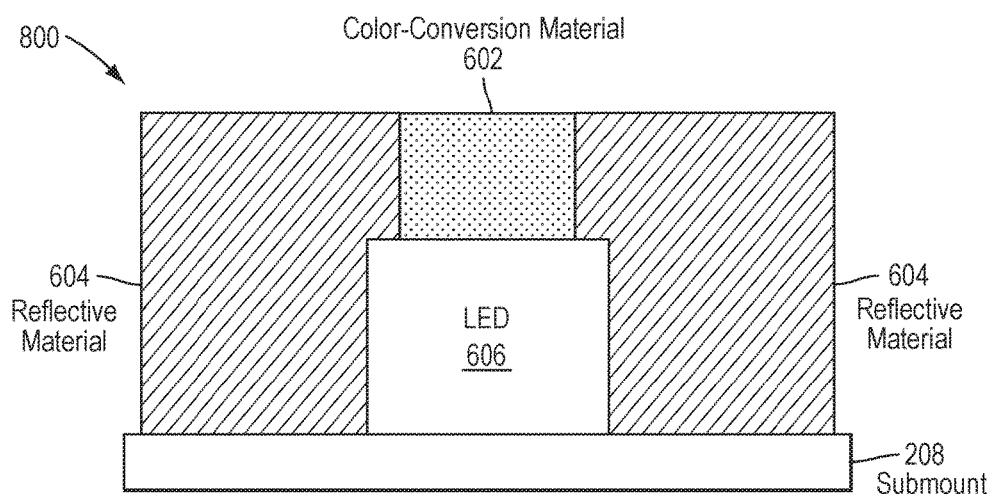
FIG. 8 depicts an LED with an undersized color-conversion layer as used in designs for a small LED source with high brightness and high efficiency, according to some embodiments.

FIG. 8 depicts an LED 800 with an undersized color-conversion layer as used in designs for a small LED source with high brightness and high efficiency. The LED device shown in FIG. 8 includes LED 606, submount 208, reflective material 604, and undersized color-conversion material 602.

The use of such an undersized color-conversion layer may be advantageous to further reduce the optical size of the white light-emitting surface with respect to the surface of the pump LED, thus increasing the brightness of the system.

Figure 9:
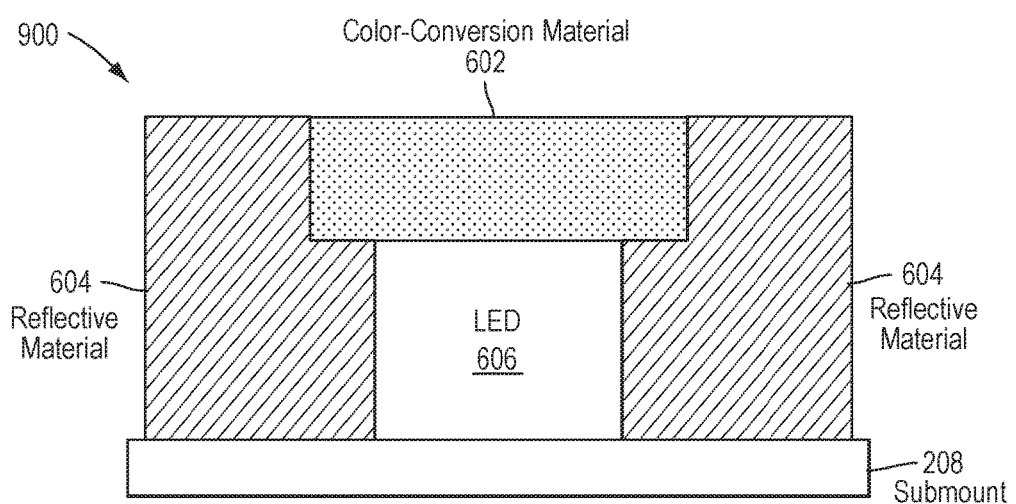
FIG. 9 depicts an LED with an oversized sized color-conversion layer as used in designs for a small LED source with high brightness and high efficiency, according to some embodiments.

FIG. 9 depicts an LED 900 with an oversized sized color-conversion layer as used in designs for a small LED source with high brightness and high efficiency. The LED device shown in FIG. 9 includes LED 606, submount 208, reflective material 604, and oversized color-conversion material 602.

The use of such an oversized color-conversion layer may be advantageous to improve the conversion efficiency of the system, by limiting the deleterious backscattering of light in the LED die.

FIG. 10A1 depicts an LED 10A100 surrounded by color-conversion material as used in designs for a small LED source with high brightness and high efficiency. The LED device shown in FIG. 10A1 includes LED 606, submount 208, reflective material 604 and color-conversion material 602.

In this embodiment, the color-conversion material is placed in proximity to the LED and reflective material is placed in proximity to the sides of the color-conversion material. This configuration may be advantageous to improve the optical efficiency of the system, by limiting the deleterious backscattering of light in the LED die. Further, in this configuration the light backscattered to the siders of the LED is more substantially color-converted light (and less substantially direct pump light from the LED). Such longer-wavelength converted light incurs lower optical loss when backscattered in the die, thus improving optical efficiency.

FIG. 10A2 depicts an LED 10A200 surrounded by color-conversion material as used in designs for a small LED source with high brightness and high efficiency. The LED device shown in FIG. 10A2 includes LED 606, submount 208, reflective material 604, color-conversion material 602, and air gap 10A210.

The embodiment shown in FIG. 10A2 is similar in some aspects to that of FIG. 10A1, however, an air gap 10A210 is present in-between the color conversion material and the reflective material. The purpose of the air gap is to reduce the amount of light escaping the color conversion material and reaching the reflective material due to total internal reflection (TIR) at the air gap interface. This can further improve device performance as light undergoing TIR is reflected without any loss. In some embodiments, the air gap has a width of 1 µm, 10 µm, 100 µm. In other embodiments, the gap is formed by a low-index substance other than air. For example, the color-conversion material may be formed of phosphor particles in an encapsulant with index n approximately equal to 1.4 or 1.5, and the low-index substance has an index approximately equal to 1.2 or 1.3. The low index may be obtained by a variety of means, for example by dielectric materials or by pores such as air pores.

In addition to the selection of color-conversion materials (e.g., as heretofore described) the selection of materials with high reflectivity can be made in order to reduce the source size while maintaining a high efficiency. The following section presents experimental data illustrating this.

Figure 10B:
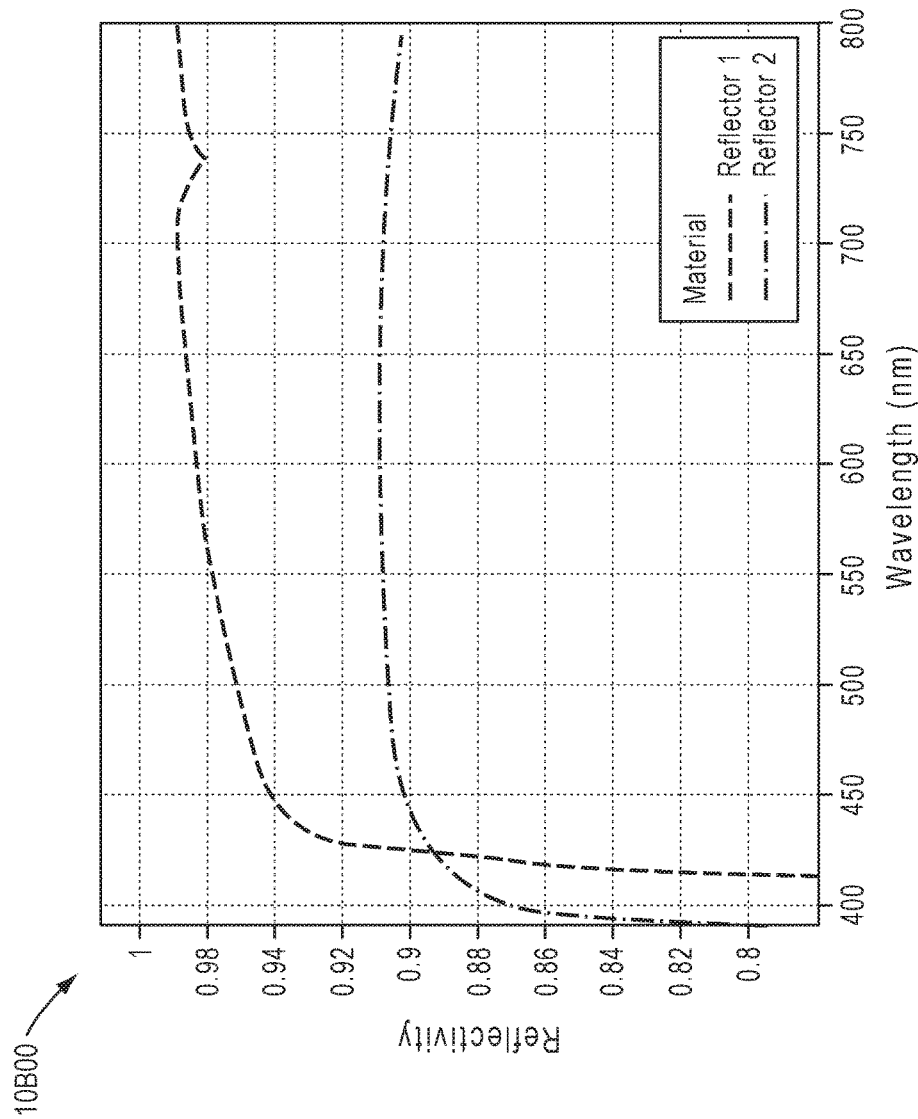
FIG. 10B through FIG. 10F depict experimental results of devices in accordance with some of the embodiments disclosed herein.

FIG. 10B shows the measured optical reflectivity spectrum of two different diffuse reflectors at normal incidence from air. The lower reflectivity material (reflector 2) has a reflectivity of less than 94% for wavelengths >500 nm. The higher reflectivity material (reflector 1) has a reflectivity of >97% for wavelengths >500 nm. Such materials can be used in embodiments. In some embodiments the reflectance is only slightly wavelength dependent. For example, in some embodiments, the reflectance can have a constant value within 1% or within 5% in the range from 400 nm to 700 nm. In some embodiments, the reflectance has a constant value within 1% or within 5% in the range from 450 nm to 700 nm. In some embodiments the reflectivity is higher than a given value (for example 90% or 95% or 99%) at all angles of incidence from the incoming medium (which may be air or an encapsulant).

The reflectivity of a high reflectivity material can be 96%, 97%, 98%, 99% or 100% depending on the material composition and method of construction. These can pertain to the values coming from air, or from an encapsulating medium (such as a silicone). In some embodiments, white diffuse reflector materials can be made from titanium oxide particles (rutile, anatase or brookite phase) dispersed in a matrix of silicone or epoxy. The titanium oxide particle sizes may range from 50 nm or smaller, 100 nm, 200 nm, 300 nm, 400 nm, 500 nm to 600 nm. In other embodiments, the diffused white reflector can be composed of a network of polyethylene or polytetrafluoroethylene particles or fibers with inter-penetrating air pores or gaps. In some embodiments, the diffuse white reflector comprises a material with air pores such as hollow silica spheres embedded in an encapsulant. In some embodiments, dichroic specular reflectors can be constructed from alternating layers of dielectric material, which layers have different refractive indices. In some embodiments, metallic specular reflectors can be made from smooth film of silver metal that is more than 200 nm in thickness.

Figure 10C:
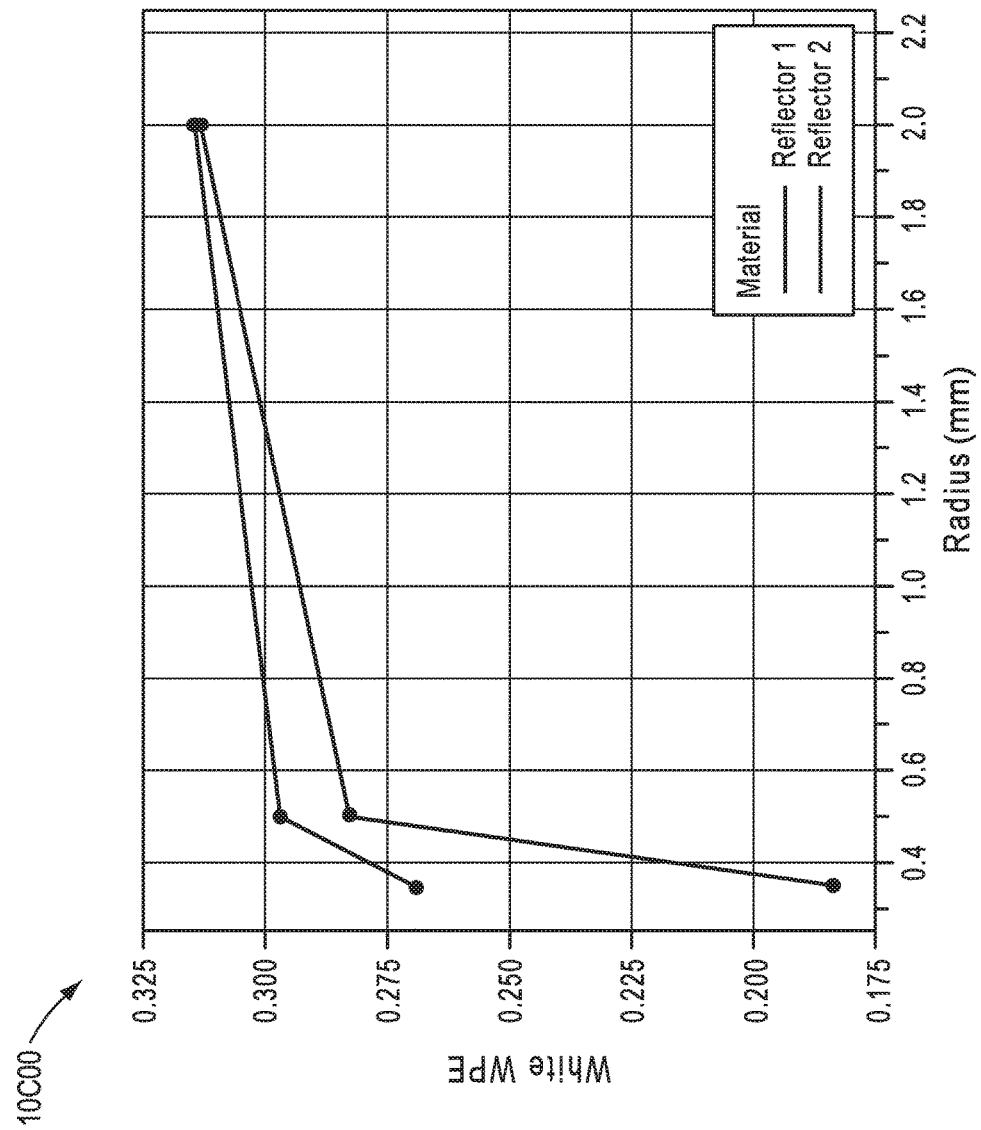

FIG. 10C shows the measured white wall plug efficiency (WPE) of LED modules (CCT of 3000K, CRI of 80, current of 80 mA and junction temperature of 85° C.) with circular light emitting areas of varying radii. The configuration of the LED modules is shown in FIG. 10A. In some embodiments, the radius of the light-emitting region can be 3 mm, 2 mm, 1 mm, 0.5 mm, 0.25 mm, 0.1 mm or smaller. As the radii of the emitting region is reduced from 2 mm to 0.35 mm, the wall plug efficiency decreases monotonically due an increase of optical losses in the white reflector cup surrounding the light-emitting region. The curves compare devices built with a higher reflectivity cup (Reflector 1) and devices built with a lower reflectivity cup (Reflector 2) as shown in FIG. 10B. For large radii (>1 mm), the effect of the reflectivity of the cup is less pronounced, the WPE difference between Reflector 1 and Reflector 2 may be less than two percent. For small radii (<0.5 mm), the reflectivity of the reflector material has a large effect on the WPE of the device, which could differ by more than five percent.

FIG. 10C illustrates results of using of materials with high reflectivity (e.g., to maintain performance when the reflector becomes close to the LED emitter). Some embodiments are further reduced in footprint, and the use of high-reflectivity materials becomes more dominant in such designs.

Figure 10D:
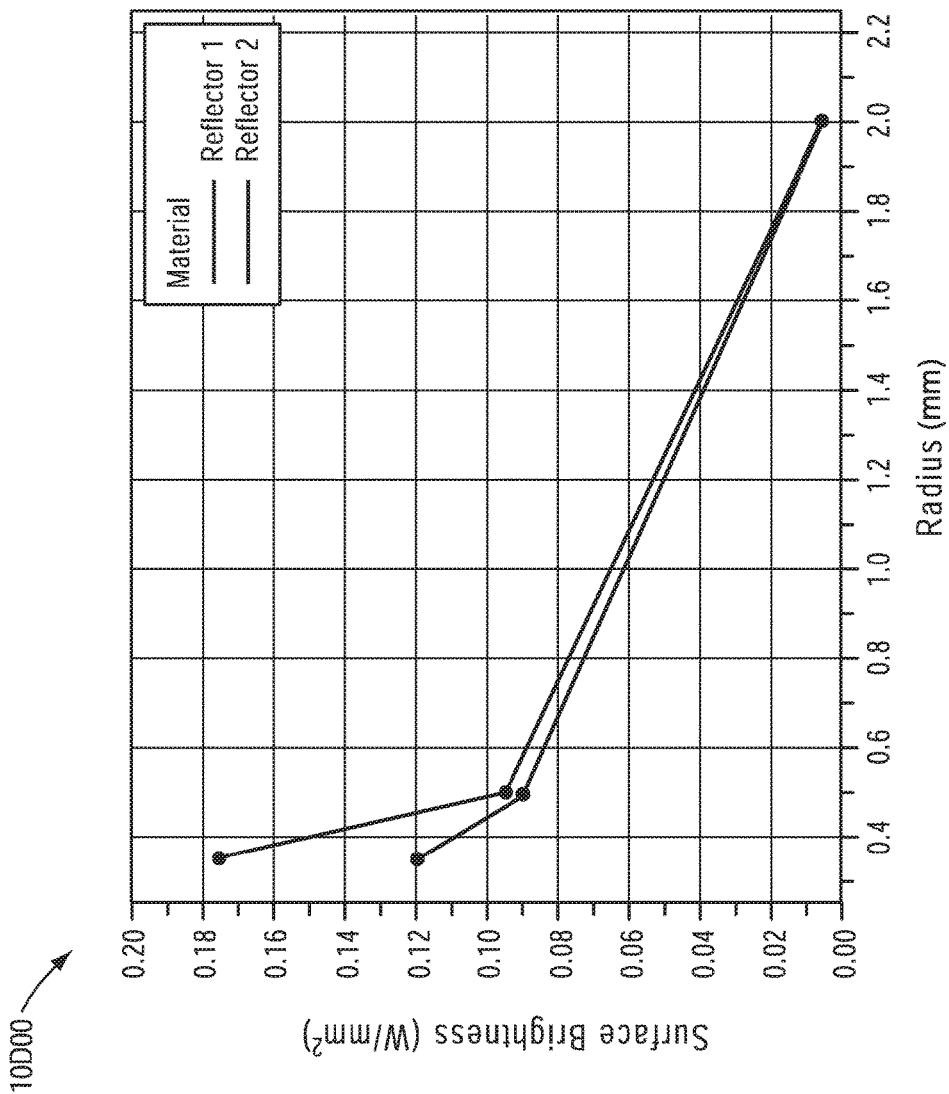

FIG. 10D shows the surface brightness (in W/mm$^2$) of LED modules (CCT of 3000K, CRI of 80, current of 80 mA and junction temperature of 85° C.) with circular light emitting areas of varying radii. As the emitting area of the LED is decreased from a circular source with 2 mm radius to one with 0.35 mm radius, the surface brightness increases monotonically because the total light emitted from the source is confined to a smaller area. The curves compare devices built with a higher reflectivity cup (Reflector 1) and devices built with a lower reflectivity cup (Reflector 2) as shown on FIG. 10B. The surface brightness of LEDs packaged with Reflector 1 increase more with decreasing emitting area compared to LEDs packaged with Reflector 2, which is composed of a lower reflectivity material. For a circular source radius of 0.35 mm, LEDs made with reflector 1 exhibit 50% greater surface brightness due to lower optical losses to the reflector cup.

Figure 10E:
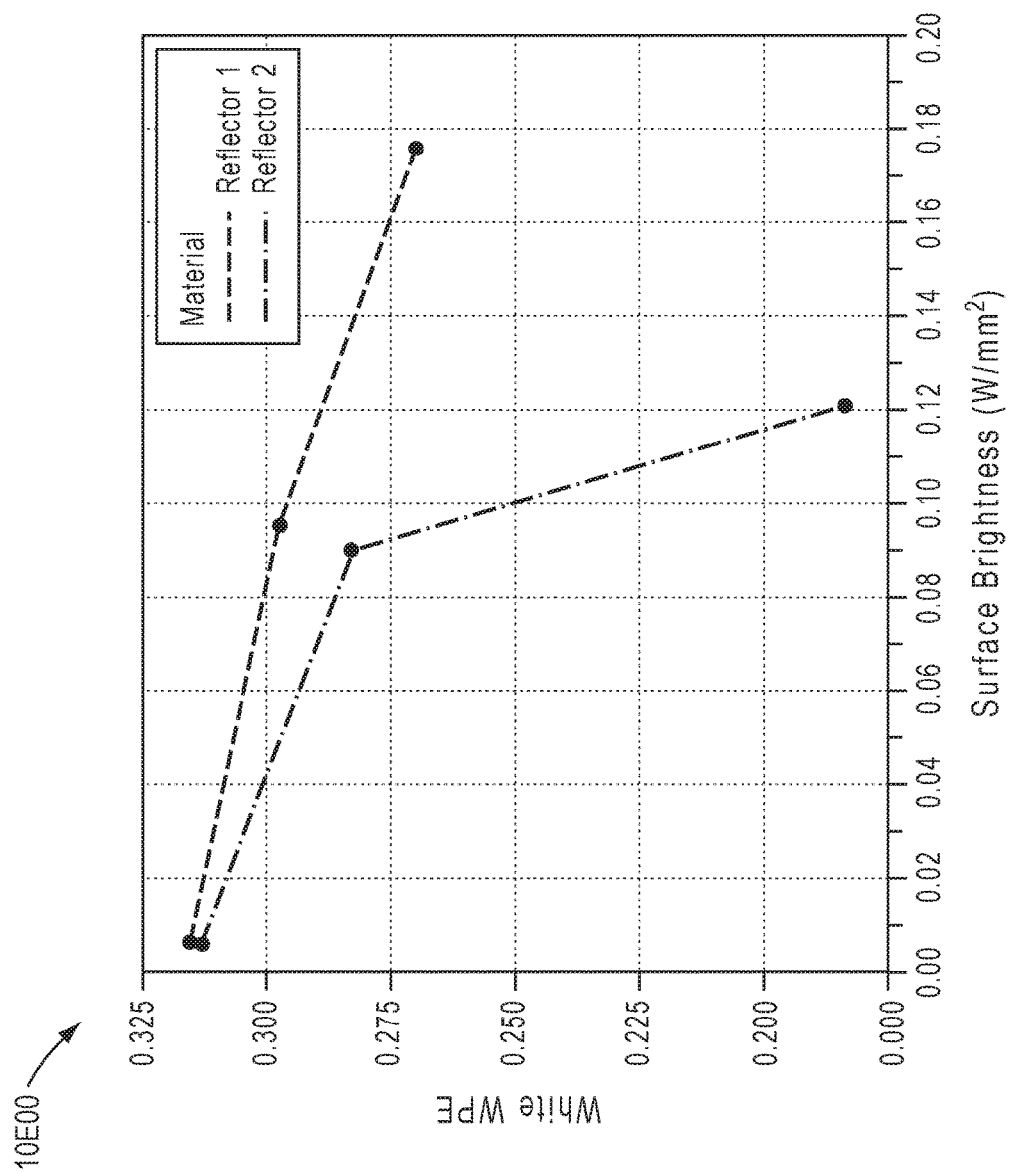

In some applications that require high surface brightness while maintaining reasonable white wall plug efficiency, the reflectivity of the cup material can be selected, managed or optimized. Given the same input current of 80 mA, the surface brightness of the source can be increased by confining the light emitting area to a smaller region, as shown in FIG. 10D. However, this comes at the cost of decreasing white WPE (as shown in FIG. 10E) due to an increase of optical losses to the reflective cup. For LEDs assembled with a lower reflectivity material (see Reflector 2), the achievable surface brightness is severely limited because the efficiency of the source drops sharply as the light-emitting area is reduced. For LEDs assembled with a higher reflectivity material (see Reflector 1), high surface brightness can be achieved with a much lower penalty in white WPE. In the example shown in FIG. 10E, the surface brightness of LEDs assembled with Reflector 1 can be increased by more than 10 times while incurring no more than 15% loss in white WPE.

Figure 10F:
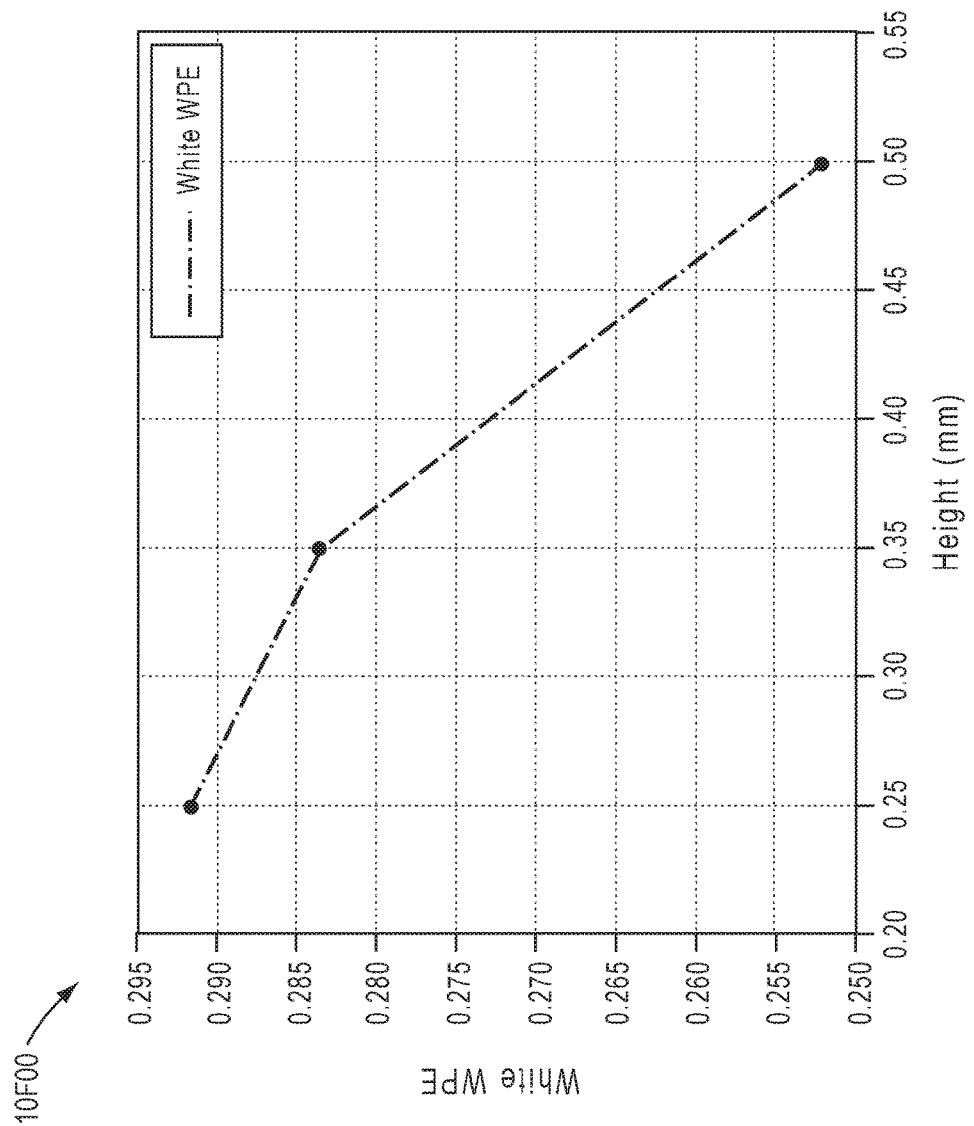

FIG. 10F depicts WPE as a function of the height of the cup. In addition to the aforementioned variables, the height of the cup can also dramatically impact the overall white WPE of small LED sources with less than 1 mm$^2$ of emitting area. In some embodiments, the thickness of the reflective cup can be 0.6 mm, 0.5 mm, 0.4 mm, 0.3 mm, 0.2 mm or 0.1 mm. As shown in FIG. 10F, for an LED device (CCT of 3000K, CRI of 80, operating at 80 mA and junction temperature of 85° C.) with a 0.5 mm radius circular light-emitting area, the white WPE of the source increases as the thickness of the reflective cup is reduced (the phosphor blend is tuned to maintain the same color point in each case). Given the same emission area, when the white LED thickness (determined by the cup height) is reduced, the proportion of light that impinges upon the reflective cup also decreases, resulting in less optical loss. For example, FIG. 10F shows that when the height of the cup (Reflector 2) is reduced from 0.5 mm to 0.25 mm, the white WPE is increased by more than 15%. This directly translates into 15% higher surface brightness because the emitting area is maintained.

In certain embodiments a combined thickness of the submount, the at least one LED, and the light-converting material is less than 2 mm, less than 1 mm, and in certain embodiments, less than 0.5 mm.

Other measures can be taken to reduce the loss in the reflective material surrounding the LED. In some cases, an air gap is created between the LED and the reflective material, or between the color conversion material and the reflective material. In such embodiments, the probability for light to reach the reflective material is decreased. For example, if the color conversion material surrounding the die has an index of about 1.4, only 50% of the diffuse light in the color conversion material will escape to the air gap and require reflection by the reflective material. The air gap may, for example, have a thickness of about 1 µm, 10 µm, 100 µm. FIG. 10A2 illustrates these embodiments.

Just as is the case for the reflective material, the reflectivity of the submount is important to maintain performance. In some embodiments, light bounces multiple times on the submount before it escapes, so that the one-bounce loss from the submount is amplified. Therefore, a high-reflectivity submount is desirable. Such high-reflectivity mirrors can be composed of a metallic mirror (such as silver) coated by a dielectric layer, or a series of dielectric layers acting as a dichroic. In some embodiments, a low-index layer is present in the stack of the submount to obtain a total internal reflection (TIR) effect: large-angle light undergoing TIR is perfectly reflected and does not travel to lossy layers of the submount.

Figure 11:
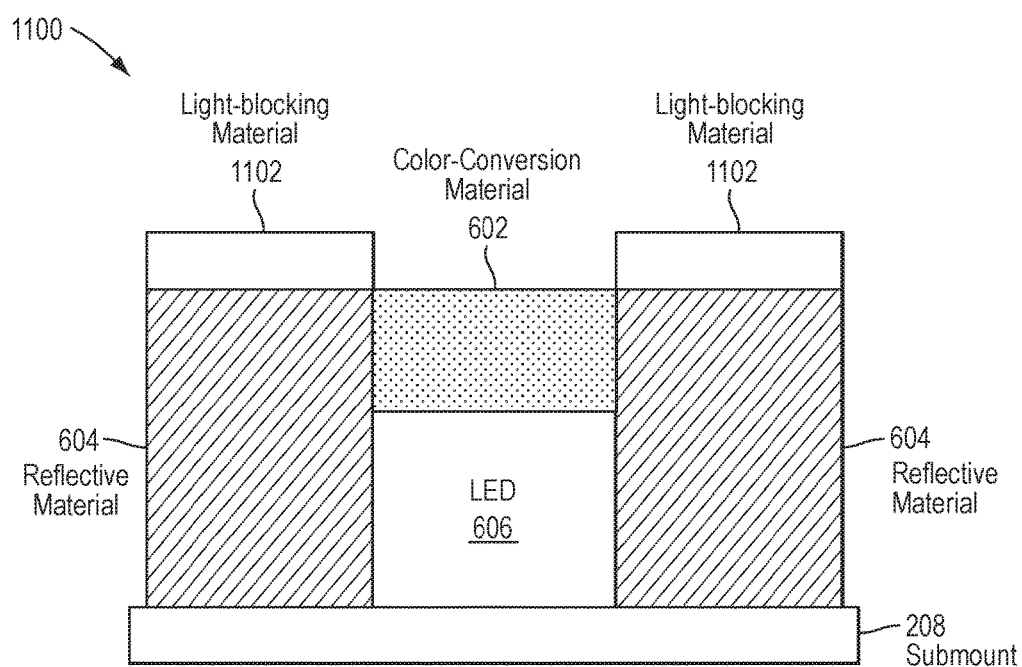
FIG. 11 depicts an LED with light-blocking regions flanking the LED as used in designs for a small LED source with high brightness and high efficiency, according to some embodiments.

FIG. 11 depicts an LED 1100 with light-blocking regions flanking the LED as used in designs for a small LED source with high brightness and high efficiency. The LED device shown in FIG. 11 includes LED 606, submount 208, reflective material 604, color-conversion material 602, and light-blocking material 1102.

In this embodiment, a light-blocking material 1102 is placed above the active region of the LED 606 to prevent emission of light that may diffuse through the reflective material 604. This light-blocking material 1102 may, for example, be a metal, or a substantially-black material.

The sidewalls of the LED need not be vertical. In some embodiments, the sidewalls of an LED can be slanted with either a positive or a negative angle from the vertical.

In some embodiments, the LED is thinned down so that only a small fraction of the light can escape from the sides. For example, the vertical-to-horizontal aspect ratio of the LED can be less than 10%. In some of these embodiments, no sidewall reflector is used. In some embodiments, this thinning approach is combined with a sidewall reflector such as one of the reflectors described in previous embodiments.

Figure 12A:
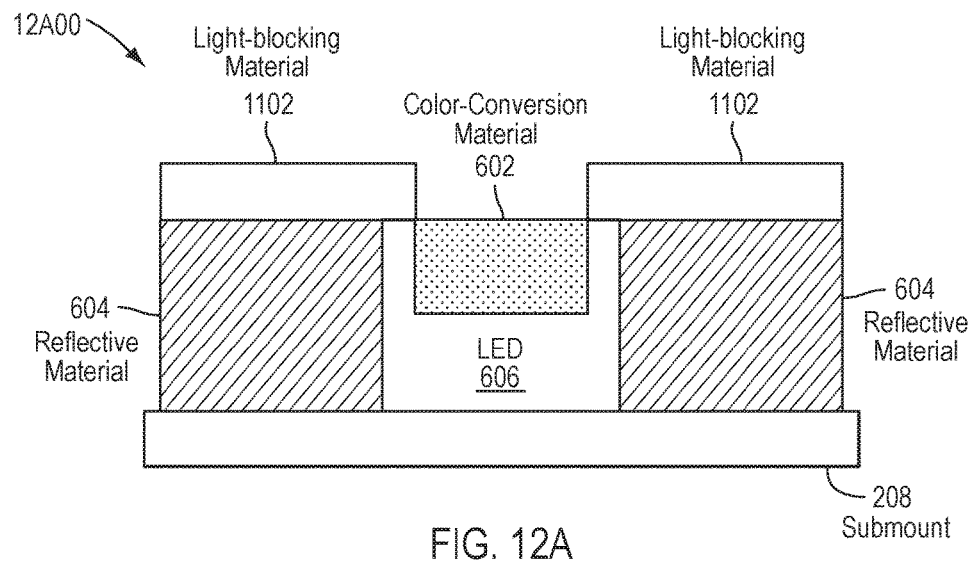
FIG. 12A depicts an LED with color-converting material disposed in a cavity of a volumetric LED as used in designs for a small LED source with high brightness and high efficiency, according to some embodiments.

FIG. 12A depicts an LED 12A00 with color-converting material disposed in a cavity of a volumetric LED as used in designs for a small LED source with high brightness and high efficiency. The LED device shown in FIG. 12A includes LED 606, submount 208, reflective material 604, color-conversion material 602, and light-blocking material 1102.

In the embodiments of FIG. 12A, the volumetric nature of the LED die can be used. A cavity is etched in the LED—for example, in the bulk GaN substrate. The cavity can be etched by dry etching or by chemical etching. This cavity is then filled with a white-emitting color-conversion material. This enables a thin LED device profile. The sidewalls of the LED may be coated with a reflective material, and a light-blocking material may be used to mask the bare outer edge of the LED.

Figure 12B:
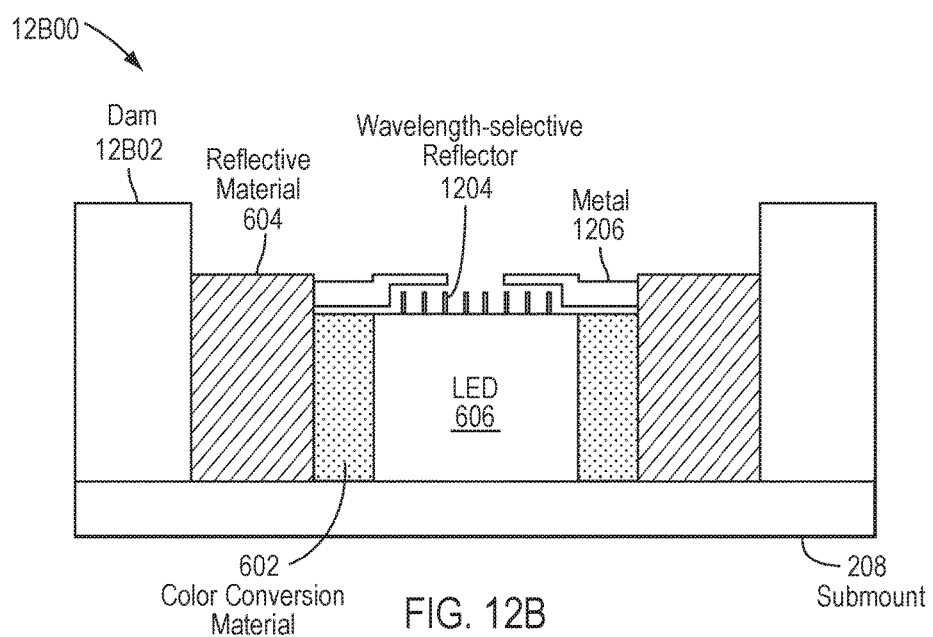
FIG. 12B depicts an LED with wavelength-selective reflector as used in designs for a small LED source with high brightness and high efficiency, according to some embodiments.

FIG. 12B depicts an LED 12B00 with wavelength-selective reflector 1204 as used in designs for a small LED source with high brightness and high efficiency. The LED device shown in FIG. 12B includes LED 606, submount 208, color-conversion material 602, reflective material 604, dam 12B02, wavelength-selective reflector 1204 and metal cap 1206.

In certain embodiments of FIG. 12B, a wavelength-selective reflector 1204 such as a dichroic mirror is incorporated to the design. This mirror may reflect the direct emission from the LED but transmit the converted light, thus decreasing or removing the need for a color-conversion material layer on top of the LED chip. Some embodiments include a metal cap 1206 that creates an aperture through which the direct emissions from the LED can pass. This metal cap can be used to shrink the emitting area, for applications requiring a specific small emitting area.

Further, some embodiments include a dam element 12B02. The dam can be used in some fabrication flows, for example: first the dam is placed around the LED, and then the color-conversion material is dispensed (i.e. in liquid of paste form) in the dam around the LED, and cured to reach a solid phase.

FIGS. 13A-13D depict LED cross-sections during a series of fabrication steps (e.g., see cross-section 13A00, see cross-section 13B00, see cross-section 13C00, see cross-section 13D00) where an LED is placed on the submount and a dam material is placed around the small LED source with high brightness and high efficiency. The devices shown in FIGS. 13A-13D include LED 606, submount 208, dam 12B02, reflective material 604, color-conversion material 602, and light-blocking material 1102.

In such a technique, the LED is placed on the submount and a dam element 12B02 is placed around the LED. Part of the volume between the dam and the LED is filled with a reflective material 604. Part of the volume around the LED is filled with color-conversion material 602. A light-blocking layer 1102 is formed above.

FIGS. 14A-14D depict LED cross-sections during a series of fabrication steps (e.g., see cross-section 14A00, see cross-section 14B00, see cross-section 14C00, see cross-section 14D00) where an LED is placed on the submount and a thin reflector is formed on the sides of the small LED source with high brightness and high efficiency. The devices shown in FIGS. 14A-14D include LED 606, submount 208, reflective material 604, and color-conversion material 602.

As depicted in FIGS. 14A-14D, the LED is placed on the submount 208 and a thin reflector 604 (such as a metal) is formed on the sides of the LED. The color-conversion material 602 is the placed on top of the LED. In some cases (e.g., as shown in FIGS. 14B-14D) a thin reflector covers both the sides of the die and color-conversion-material mesa to facilitate top-side only emissions.

Figure 15A:
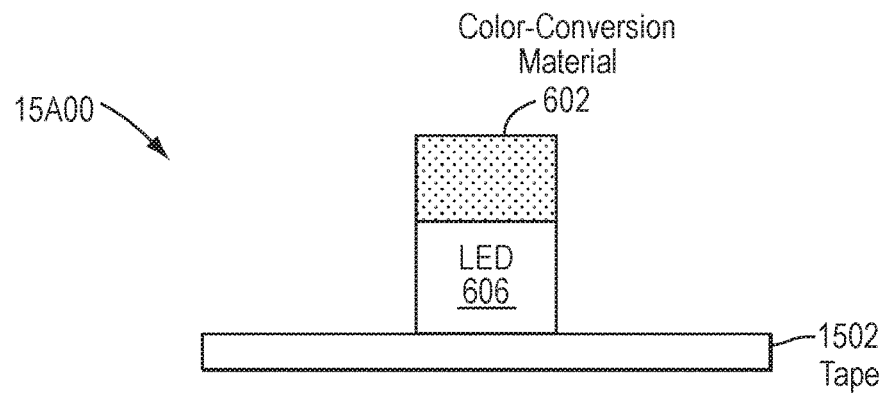
FIGS. 15A-15C depict LED cross-sections during a series of fabrication steps where a color-conversion layer is placed on the top of the small LED source with high brightness and high efficiency, according to fabrication of some embodiments.
Figure 15B:
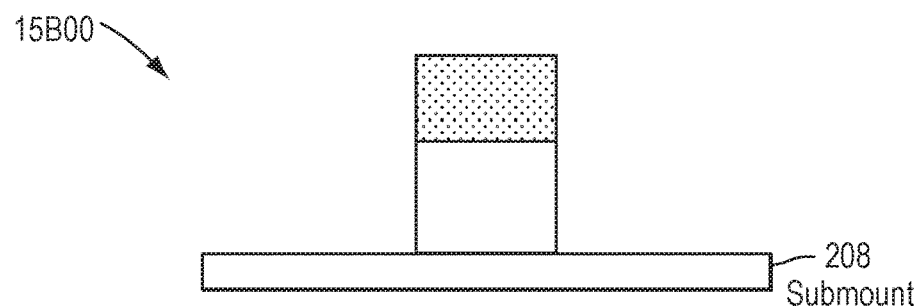
Figure 15C:
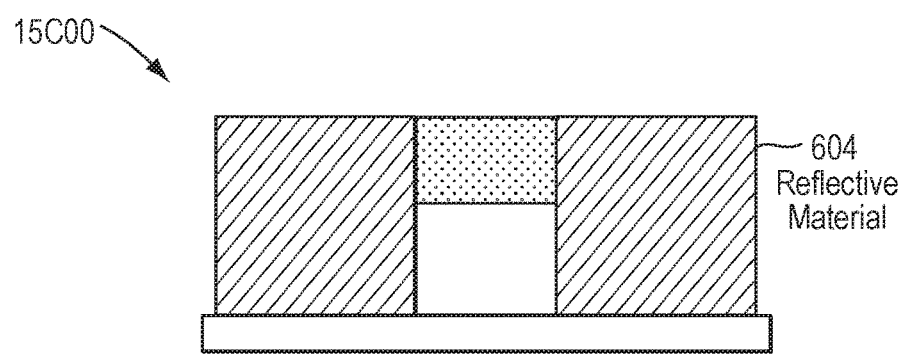

FIGS. 15A-15C depict LED cross-sections during a series of fabrication steps (e.g., see cross-section 15A00, see cross-section 15B00, see cross-section 15C00, see cross-section 15D00) where a color-conversion layer is placed on the top of the small LED source with high brightness and high efficiency. The LED devices shown in FIGS. 15A-15C include LED 606, color-conversion material 602, tape 1502, submount 208, and reflective material 604.

In another technique, the color-conversion layer is first placed on the top of the LED—for example while the LED is on a tape. The LED is then attached to the submount. Finally the reflective material is formed around the LED.

Figure 16A:
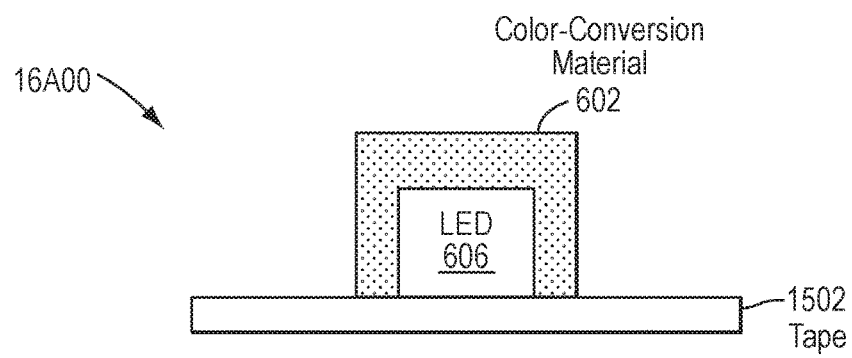
FIGS. 16A-16C depict LED cross-sections during a series of fabrication steps where a color-conversion material is disposed to surround the small LED source with high brightness and high efficiency, according to fabrication of some embodiments.
Figure 16B:
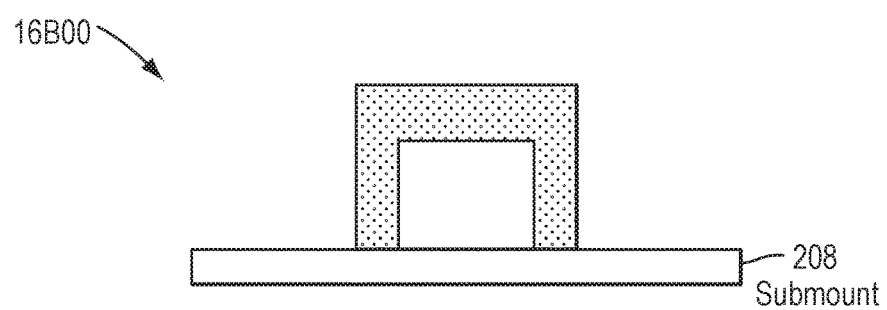
Figure 16C:
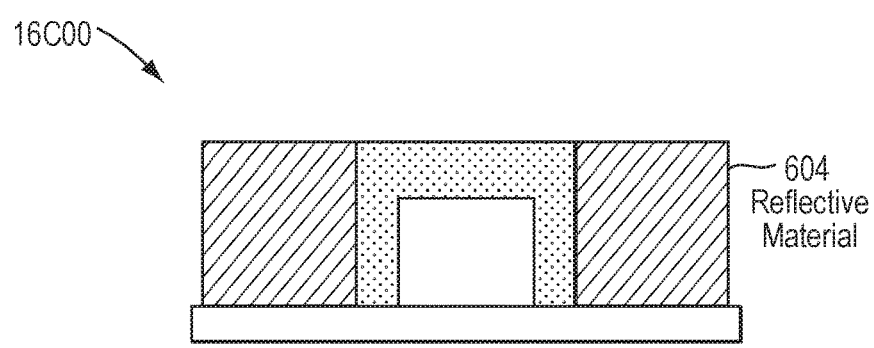

FIGS. 16A-16C depict LED cross-sections during a series of fabrication steps 16A00-16C00 where a color-conversion material is disposed to surround the small LED source with high brightness and high efficiency. The LED devices shown in FIGS. 16A-16C include LED 606, color-conversion material 602, tape 1502, submount 208, and reflective material 604.

In another technique, the color-conversion layer is first placed around LED (e.g., while the LED is on a tape). The LED is then attached to the submount. The reflective material is formed around the color-conversion material.

Some approaches use a modified electrode layout to enable high brightness operation from a small footprint. As previously discussed and shown as pertaining FIG. 2, in traditional LEDs, the n-electrode occupies a minimum size of 100 μm×100 μm and above. For a device footprint of 200 μm×200 μm, only 75% of the device area is being used for light generation. In some embodiments of the present disclosure, the device area is 200 μm×200 μm or less, and the light-generating area is at least 80% of the device area.

In some embodiments, this is obtained using a vertical chip geometry.

Figure 17:
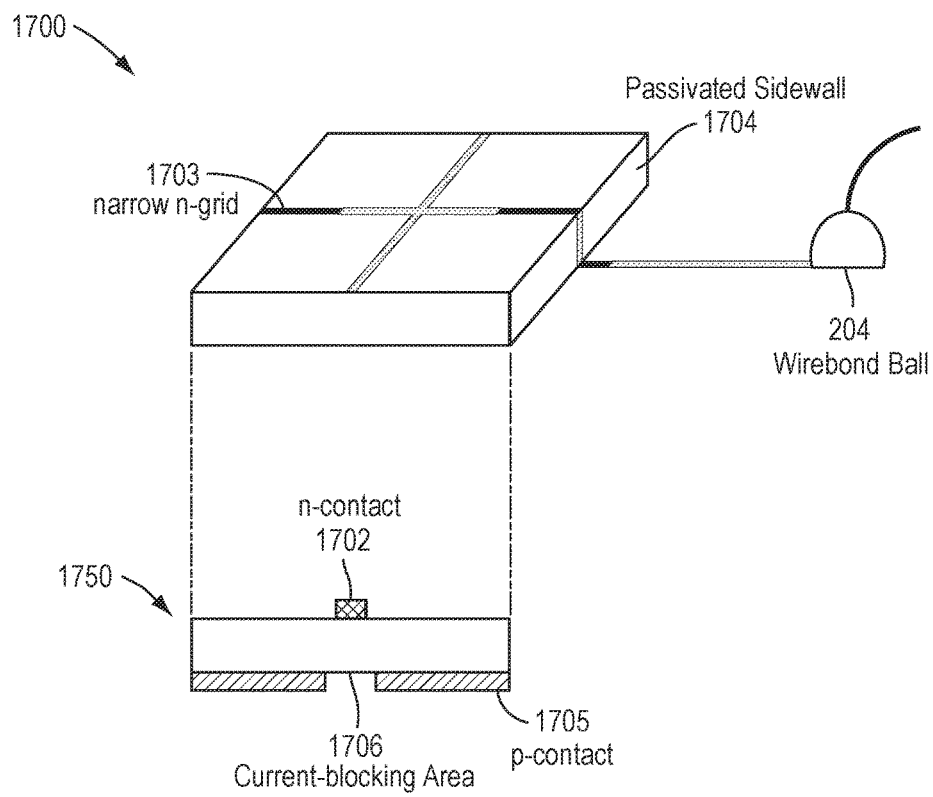
FIG. 17 depicts an electrode scheme used with an LED having a vertical chip geometry to form a small LED source with high brightness and high efficiency, according to some embodiments.

FIG. 17 depicts an electrode scheme used with an LED 1700 having a vertical chip geometry to form a small LED source with high brightness and high efficiency.

As shown in FIG. 17, a narrow n-grid 1703 (for example, 5 μm wide or 1 μm wide) covers part of the top surface of the LED. The electrode runs to the side of the LED along one of the sidewalls 1704 that has been passivated, for example, by deposition of a dielectric layer (see passivated sidewall 1704). An n-wirebond ball 204 is placed away from the LED so that it does not contribute to light occlusion or shadowing or a reduction of the light generation area. The narrow n-grid has an area that is less than 20% of the footprint of the LED. Also shown in FIG. 17 is a cross-section 1750 of the LED, showing the p-contact 1705 (where light is generated) and a current-blocking area 1706 under the n-contact 1702 to prevent light generation there.

Figure 18:
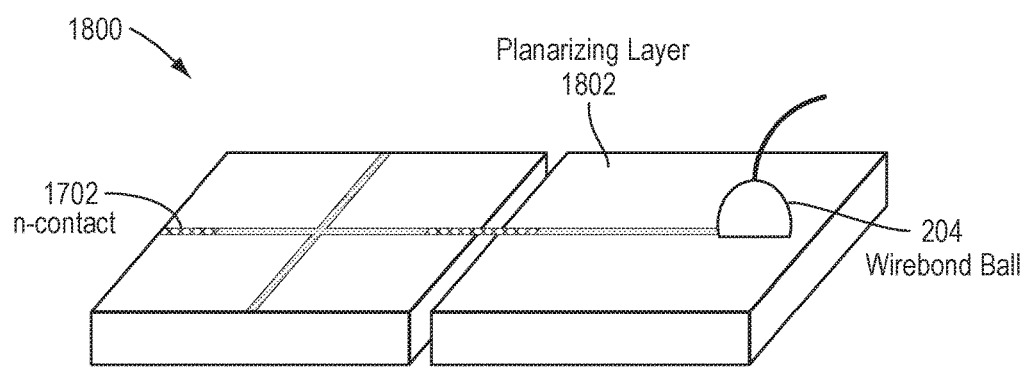
FIG. 18 depicts an LED having a narrow n-grid that covers part of the top surface of a small LED source with high brightness and high efficiency, according to some embodiments.

FIG. 18 depicts an LED 1800 having a narrow n-grid that covers part of the top surface of a small LED source with high brightness and high efficiency.

In another embodiment, as shown in FIG. 18, the n-grid runs to the side of the LED on a planarizing layer 1802 rather than on a sidewall of the LED.

In some embodiments, the modified electrode layout is obtained in a flip-chip technology.

Figure 19:
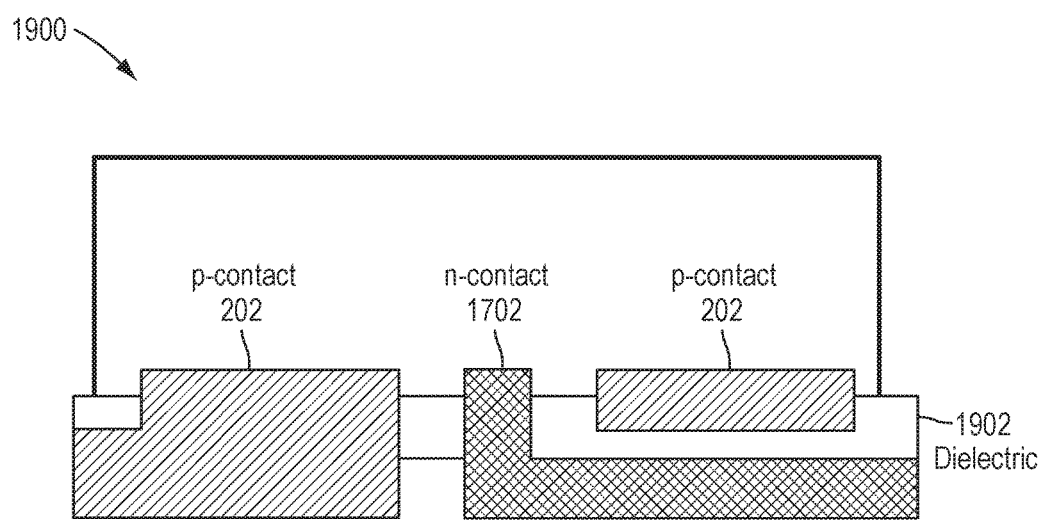
FIG. 19 depicts a flip-chip LED having a narrow n-grid that covers part of the top surface of a small LED source with high brightness and high efficiency, according to some embodiments.

FIG. 19 depicts a flip-chip LED 1900 having a narrow n-grid that covers part of the top surface of a small LED source with high brightness and high efficiency. The device shown in FIG. 19 includes p-contact 202, n-contact 1702, and dielectric 1902.

In one such embodiment (as shown in FIG. 19), the n-contact area is a small fraction of the light-emitting area. The submount contains several layers which reconfigure the n and p electrodes, increasing the area of the n-electrode under the LED for interconnect purposes. Dielectric layers (e.g., dielectric 1902) are employed to isolate the p and n electrodes. The two p-contact parts of the LED are connected laterally out of the plane of the figure.

As shown in FIGS. 17 and 18, the n-electrode may have a cross shape or another shape in order to improve current spreading in the LED.

Any of the schemes shown or referenced in FIGS. 18 and 19 use the same area of n-contact and light-generation blocking layers near the active layer, however, flip-chip embodiments often features a guard band around the n-contact that operate to decrease the usable area for light emission. On the other hand, the flip-chip configuration is more-compatible with certain fabrication techniques, which can be used to create small emitting surfaces.

The examples herein describe in detail examples of constituent elements of the herein-disclosed embodiments. It will be apparent to those skilled in the art that many modifications, both to materials and methods, may be practiced without departing from the scope of the disclosure.

Embodiments of the herein-disclosed LEDs can be used in various lamps and in various applications. Such lamps and applications can include automotive forward lighting or camera flash applications. The aforementioned automotive forward lighting or camera flash applications are merely some embodiments. Other lamps can include lamps that conform to fit with any one or more of a set of mechanical and electrical standards. Table 1 gives standards (see "Designation") and corresponding characteristics.

TABLE 1

| Designation | Base Diameter (Crest of thread) | Name | IEC 60061-1 standard sheet |
|---|---|---|---|
| E5 | 5 mm | Lilliput Edison Screw (LES) | 7004-25 |
| E10 | 10 mm | Miniature Edison Screw (MES) | 7004-22 |
| E11 | 11 mm | Mini-Candelabra Edison Screw (mini-can) | (7004-6-1) |
| E12 | 12 mm | Candelabra Edison Screw (CES) | 7004-28 |
| E14 | 14 mm | Small Edison Screw (SES) | 7004-23 |
| E17 | 17 mm | Intermediate Edison Screw (IES) | 7004-26 |
| E26 | 26 mm | [Medium] (one-inch) Edison Screw (ES or MES) | 7004-21A-2 |
| E27 | 27 mm | [Medium] Edison Screw (ES) | 7004-21 |
| E29 | 29 mm | [Admedium] Edison Screw (ES) | |
| E39 | 39 mm | Single-contact (Mogul) Giant Edison Screw (GES) | 7004-24-A1 |
| E40 | 40 mm | (Mogul) Giant Edison Screw (GES) | 7004-24 |

Additionally, the base member of a lamp can be of any form factor configured to support electrical connections, which electrical connections can conform to any of a set of types or standards. For example, Table 2 gives standards (see "Type") and corresponding characteristics, including mechanical spacing between a first pin (e.g., a power pin) and a second pin (e.g., a ground pin).

TABLE 2

| Type | Standard | Pin center to center | Pin diameter | Usage |
|---|---|---|---|---|
| G4 | IEC 60061-1 (7004-72) | 4.0 mm | 0.65-0.75 mm | MR11 and other small halogens of 5/10/20 watt and 6/12 volt |

TABLE 2-continued

| Type | Standard | Pin center to center | Pin diameter | Usage |
|---|---|---|---|---|
| GU4 | IEC 60061-1 (7004-108) | 4.0 mm | 0.95-1.05 mm | |
| GY4 | IEC 60061-1 (7004-72A) | 4.0 mm | 0.65-0.75 mm | |
| GZ4 | IEC 60061-1 (7004-64) | 4.0 mm | 0.95-1.05 mm | |
| G5 | IEC 60061-1 (7004-52-5) | 5 mm | | T4 and T5 fluorescent tubes |
| G5.3 | IEC 60061-1 (7004-73) | 5.33 mm | 1.47-1.65 mm | |
| G5.3-4.8 | IEC 60061-1 (7004-126-1) | | | |
| GU5.3 | IEC 60061-1 (7004-109) | 5.33 mm | 1.45-1.6 mm | |
| GX5.3 | IEC 60061-1 (7004-73A) | 5.33 mm | 1.45-1.6 mm | MR16 and other small halogens of 20/35/50 watt and 12/24 volt |
| GY5.3 | IEC 60061-1 (7004-73B) | 5.33 mm | | |
| G6.35 | IEC 60061-1 (7004-59) | 6.35 mm | 0.95-1.05 mm | |
| GX6.35 | IEC 60061-1 (7004-59) | 6.35 mm | 0.95-1.05 mm | |
| GY6.35 | IEC 60061-1 (7004-59) | 6.35 mm | 1.2-1.3 mm | Halogen 100 W 120 V |
| GZ6.35 | IEC 60061-1 (7004-59A) | 6.35 mm | 0.95-1.05 mm | |
| G8 | | 8.0 mm | | Halogen 100 W 120 V |
| GY8.6 | | 8.6 mm | | Halogen 100 W 120 V |
| G9 | IEC 60061-1 (7004-129) | 9.0 mm | | Halogen 120 V (US)/ 230 V(EU) |
| G9.5 | | 9.5 mm | 3.10-3.25 mm | Common for theatre use, several variants |
| GU10 | | 10 mm | | Twist-lock 120/230-volt MR16 halogen lighting of 35/50 watt, since mid-2000s |
| G12 | | 12.0 mm | 2.35 mm | Used in theatre and single-end metal halide lamps |
| G13 | | 12.7 mm | | T8 and T12 fluorescent tubes |
| G23 | | 23 mm | 2 mm | |
| GU24 | | 24 mm | | Twist-lock for self-ballasted compact fluorescents, since 2000s |
| G38 | | 38 mm | | Mostly used for high-wattage theatre lamps |
| GX53 | | 53 mm | | Twist-lock for puck-shaped under-cabinet compact fluorescents, since 2000s |

The list in Table 2 is representative and should not be taken to include all the standards or form factors that may be utilized within embodiments described herein.

In some embodiments the present disclosure can be applied toward directional lighting applications as depicted in FIG. 20A1 through FIG. 20I. In these embodiments, one or more light-emitting diodes 20A10, as taught by this disclosure, can be mounted on a submount or package to provide an electrical interconnection. The submount or package can be a ceramic, oxide, nitride, semiconductor, metal, or combination thereof, that include electrical interconnection capability 20A20 for the various LEDs. The submount or package can be mounted to a heatsink member 20B50 via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials can form a light source 20A30. One or more light sources can be interconnected into an array 20B20, which is in turn in electrical contact with connectors 20B10 and brought into an assembly 20B30. One or more lens elements 20B40 can be optically coupled to the light source. The lens design and properties can be selected so that the desired directional beam pattern for a lighting product is achieved for a given LES. The directional lighting product may be an LED module, a retrofit lamp 20B70, or a lighting fixture 20C30. In the case of a retrofit lamp, an electronic driver can be provided with a surrounding member 20B60, the driver to condition electrical power from an external source to render it suitable for the LED light source. The driver can be integrated into the retrofit lamp. In the case of a fixture, an electronic driver is provided which conditions electrical power from an external source to make it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of suitable external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based MR16, PAR16, PAR20, PAR30, PAR38, BR30, A19 and various other lamp types. Examples of fixtures include replacements for halogen-based and ceramic metal halide-based directional lighting fixtures.

In some embodiments, the present disclosure can be applied to non-directional lighting applications. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing, that includes electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination thereof. The LEDs can be distributed to provide a desired shape of the light source. For example, one common shape is a linear light source for replacement of conventional fluorescent linear tube lamps. One or more optical elements can be coupled to the LEDs to provide a desired non-directional light distribution. The non-directional lighting product may be an LED module, a retrofit lamp, or a lighting fixture. In the case of a retrofit lamp, an electronic driver can be provided to condition electrical power from an external source to render it suitable for the LED light source, with the driver integrated into the retrofit lamp. In the case of a fixture, an electronic driver is provided to condition electrical power from an external source to render it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based replacements for various linear, circular, or curved fluorescent lamps. An example of a non-directional lighting product is shown in FIG. 20C. Such a lighting fixture can include replacements for fluorescent-based troffer luminaires. In this embodiment, LEDs are mechanically secured into a package 20C10, and multiple packages are arranged into a suitable shape such as linear array 20C20.

Some embodiments of the present disclosure can be applied to backlighting for flat panel display applications. In these embodiments, one or more light-emitting diodes (LEDs), as taught by this disclosure, can be mounted on a submount or package to provide an electrical interconnection. The submount or package can be a ceramic, oxide, nitride, semiconductor, metal, or combination of any of the foregoing that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The LEDs can be distributed to provide a desired shape of the light source. One common shape is a linear light source. The light source can be optically coupled to a lightguide for the backlight. This can be achieved by coupling at the edge of the lightguide (edge-lit), or by coupling light from behind the lightguide (direct-lit). The lightguide distributes light uniformly toward a controllable display, such as a liquid crystal display (LCD) panel. The display converts the LED light into desired images based on electrical control of light transmission and its color. One way to control the color is by use of filters (e.g., color filter substrate 20D40, filter substrate 20D40). Alternatively, multiple LEDs may be used and driven in pulsed mode to sequence the desired primary emission colors (e.g., using a red LED 20D30, a green LED 20D10, and a blue LED 20D20). Optional brightness-enhancing films may be included in the backlight "stack". The brightness-enhancing films narrow the flat panel display emission to increase brightness at the expense of the observer viewing angle. An electronic driver can be provided to condition electrical power from an external source to render it suitable for the LED light source for backlighting, including any color sequencing or brightness variation per LED location (e.g., one-dimensional or two-dimensional dimming). Examples of external power sources include mains AC (e.g., 120 Vrms AC or 240 Vrms AC), low-voltage AC (e.g., 12 VAC), and low-voltage DC (e.g., 12 VDC). Examples of backlighting products are shown in FIG. 20D1, FIG. 20D2, FIG. 20E1 and FIG. 20E2.

Some embodiments of the present disclosure can be applied to automotive forward lighting applications, as shown in FIG. 20F. In these embodiments, one or more light-emitting diodes (LEDs) can be mounted on a submount or on a rigid or semi-rigid package 20F10 to provide an electrical interconnection. The submount or package can be a ceramic, oxide, nitride, semiconductor, metal, or combination thereof, that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials form a light source. One or more lens elements 20F20 can be optically coupled to the light source. The lens design and properties can be selected to produce a desired directional beam pattern for an automotive forward lighting application 20F30 for a given LED. An electronic driver can be provided to condition electrical power from an external source to render it suitable for the LED light source. Examples of external power sources for automotive applications include low-voltage DC (e.g., 12 VDC). An LED light source may perform a high-beam function, a low-beam function, a side-beam function, or any combination thereof. An example of an automotive forward lighting product is shown in FIG. 20F.

In some embodiments, the present disclosure can be applied to digital imaging applications, such as illumination for mobile-phone and digital still cameras. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing, that include electrical interconnection capability for the various LEDs. The submount or package can be mounted to a circuit board member. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination thereof. The total light emitting surface (LES) of the LEDs and any down-conversion materials form a light source. One or more lens elements can be optically coupled to the light source. The lens design and properties can be selected so that the desired directional beam pattern for an imaging application is achieved for a given LES. An electronic driver can be provided to condition electrical power from an external source to render it suitable for the LED light source. Examples of suitable external power sources for imaging applications include low-voltage DC (e.g., 5 VDC). An LED light source may perform a high-beam function, low-beam function, side-beam function, daytime-running-light, or any combination thereof. An example of an imaging lighting product is shown in FIG. 20G.

FIG. 20 is a diagram illustrating a smart phone architecture 20H00. As shown, the smart phone 20H06 includes a housing, display, and interface device, which may include a button, microphone, and/or touch screen. In certain embodiments, a phone has a high resolution camera device, which can be used in various modes. An example of a smart phone can be an iPhone from Apple Inc. of Cupertino, Calif. Alternatively, a smart phone can be a Galaxy from Samsung or others.

In an example, the smart phone may include one or more of the following features (which are found in an iPhone 4 from Apple Inc., although there can be variations), see www.apple.com:

GSM model: UMTS/HSDPA/HSUPA (850, 900, 1900, 2100 MHz); GSM/EDGE (850, 900, 1800, 1900 MHz)
  CDMA model: CDMA EV-DO Rev. A (800, 1900 MHz)
  802.11b/g/n Wi-Fi (802.11n 2.4 GHz only)
  Bluetooth 2.1+EDR wireless technology
  Assisted GPS
  Digital compass
  Wi-Fi
  Cellular
  Retina display
  3.5-inch (diagonal) widescreen multi-touch display
  800:1 contrast ratio (typical)
  500 cd/m2 max brightness (typical)
  Fingerprint-resistant oleophobic coating on front and back
  Support for display of multiple languages and characters simultaneously
  5-megapixel iSight camera
  Video recording, HD (720p) up to 30 frames per second with audio
  VGA-quality photos and video at up to 30 frames per second with the front camera
  Tap to focus video or still images
  LED flash
  Photo and video geotagging
  Built-in rechargeable lithium-ion battery
  Charging via USB to computer system or power adapter
  Talk time: Up to 7 hours on 3G, up to 14 hours on 2G (GSM)
  Standby time: Up to 300 hours
  Internet use: Up to 6 hours on 3G, up to 10 hours on Wi-Fi
  Video playback: Up to 10 hours
  Audio playback: Up to 40 hours
  Frequency response: 20 Hz to 20,000 Hz
  Audio formats supported: AAC (8 to 320 Kbps), protected AAC (from iTunes Store), HE-AAC, MP3 (8 to 320 Kbps), MP3 VBR, audible (formats 2, 3, 4, audible enhanced audio, AAX, and AAX+), Apple lossless, AIFF, and WAV
  User-configurable maximum volume limit
  Video out support at up to 720p with Apple digital AV adapter or Apple VGA adapter; 576p and 480p with Apple component AV cable; 576i and 480i with Apple composite AV cable (cables sold separately)
  Video formats supported: H.264 video up to 720p, 30 frames per second, main profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, simple profile with AAC-LC audio up to 160 Kbps per channel, 48 kHz, stereo audio in .m4v, .mp4, and .mov file formats; motion JPEG (M-JPEG) up to 35 Mbps, 1280 by 720 pixels, 30 frames per second, audio in ulaw, PCM stereo audio in .avi file format
  Three-axis gyro
  Accelerometer
  Proximity sensor
  Ambient light sensor Embodiment of the present disclosure may be used with other electronic devices. Examples of suitable electronic devices include a portable electronic device, such as a media player, a cellular phone, a personal data organizer, or the like. In such embodiments, a portable electronic device may include a combination of the functionalities of such devices. In addition, an electronic device may allow a user to connect to and communicate through the Internet or through other networks, such as local or wide area networks. For example, a portable electronic device may allow a user to access the internet and to communicate using e-mail, text messaging, instant messaging, or using other forms of electronic communication. By way of example, the electronic device may be similar to an iPod having a display screen or an iPhone available from Apple Inc.

In certain embodiments, a device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, the device may be sized such that it fits relatively easily into a pocket or the hand of the user. While certain embodiments of the present disclosure are described with respect to portable electronic devices, it should be noted that the presently disclosed techniques may be applicable to a wide array of other, less portable, electronic devices and systems that are configured to render graphical data, such as a desktop computer.

FIG. 20I depicts an interconnection of components in an electronic device 20I00. Examples of electronic devices include an enclosure or housing, a display, user input structures, and input/output connectors in addition to the aforementioned interconnection of components. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light emitting diode (LED) based display, an organic light emitting diode (OLED) based display, or some other suitable display. In accordance with certain embodiments of the present disclosure, the display may display a user interface and various other images such as logos, avatars, photos, album art, and the like. Additionally, in certain embodiments, a display may include a touch screen through which a user may interact with the user interface. The display may also include various functions and/or system indicators to provide feedback to a user such as power status, call status, memory status, or the like. These indicators may be incorporated into the user interface displayed on the display.

In certain embodiments, one or more of the user input structures can be configured to control the device, such as by controlling a mode of operation, an output level, an output type, etc. For example, the user input structures may include a button to turn the device on or off. Further, the user input structures may allow a user to interact with the user interface on the display. Embodiments of the portable electronic device may include any number of user input structures, including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

Certain device may also include various input and output ports to allow connection of additional devices. For example, a port may be a headphone jack that provides for the connection of headphones. Additionally, a port may have both input and output capabilities to provide for connection of a headset (e.g., a headphone and microphone combination). Embodiments of the present disclosure may include any number of input and/or output ports, such as headphone and headset jacks, universal serial bus (USB) ports, IEEE-1394 ports, and AC and/or DC power connectors. Further, a device may use the input and output ports to connect to and send or receive data with any other device, such as other portable electronic devices, personal computers, printers, or the like. For example, in one embodiment, the device may connect to a personal computer via an IEEE-1394 connection to send and receive data files such as media files. Further details of the device can be found in U.S. Pat. No. 8,294,730.

Figure 20H:
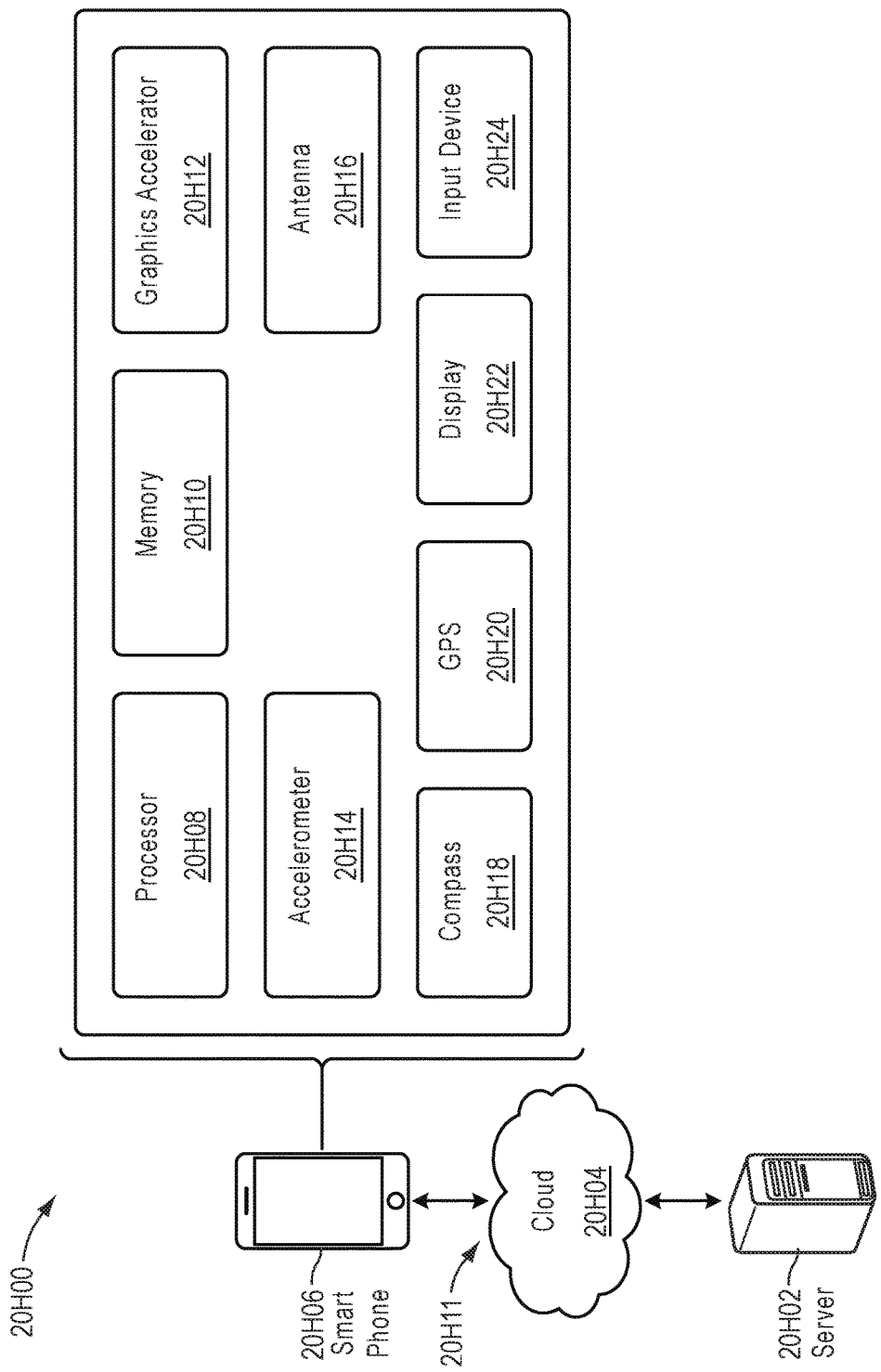
Figure 201:
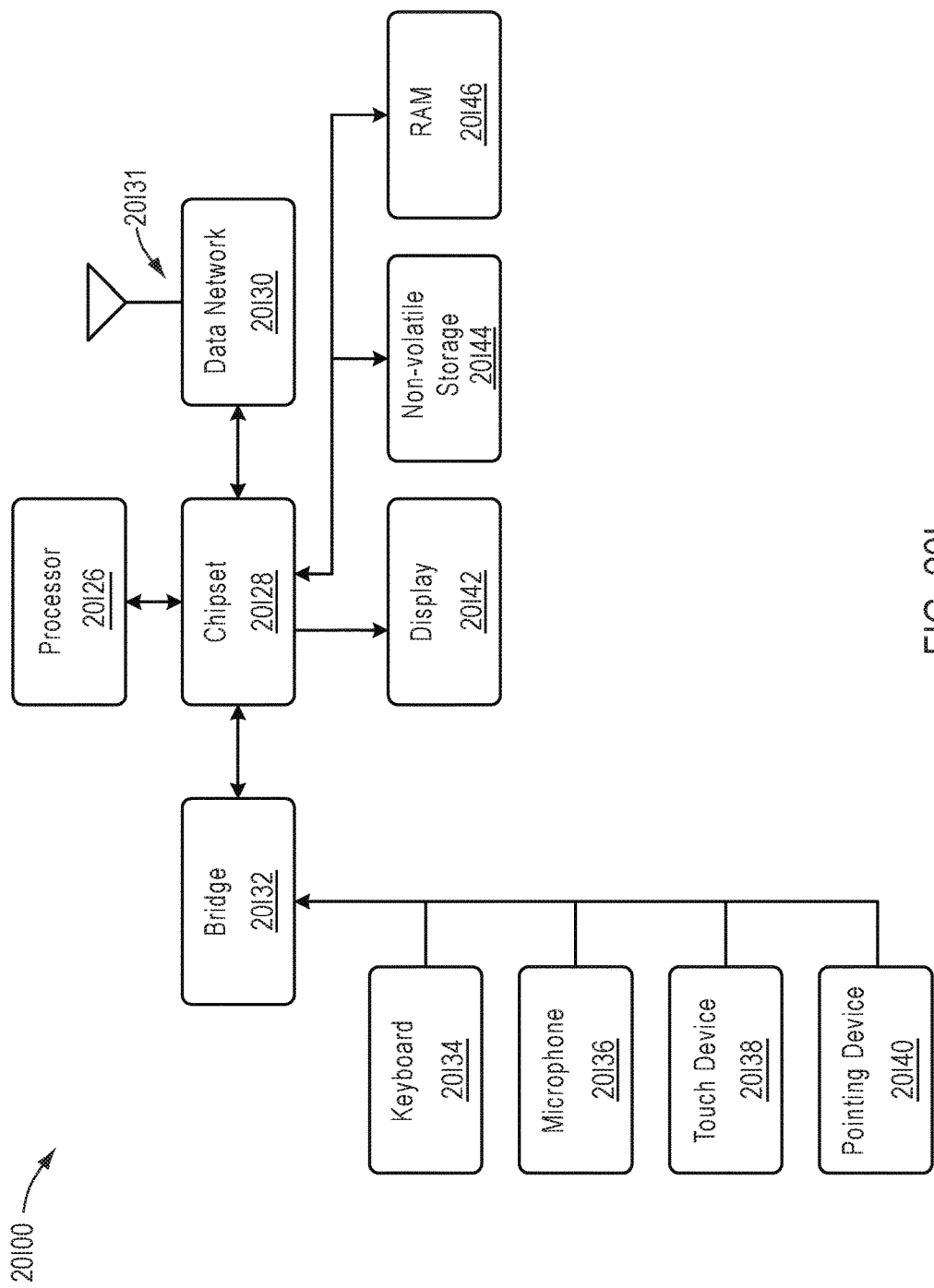

FIG. 20H is a system diagram with a smart phone according to an embodiment of the present disclosure. A server 20H02 is in electronic communication with a handheld electronic device 20H06 having functional components such as a processor 20H08, memory 20H10, graphics accelerator 20H12, accelerometer 20H14, communications interface 20H11, compass 20H18, GPS 20H20, display 20H22, and an input device 20H24. Each device is not limited to the illustrated components. The components may be hardware, software or a combination of both.

In some examples, instructions can be input to the handheld electronic device 20H06 through an input device 20H24 that instructs the processor 20H08 to execute functions in an electronic imaging application. One potential instruction can be to generate a wireframe of a captured image of a portion of a human user. In that case the processor 20H08 instructs the communications interface 20H11 to communicate with the server 20H02 and transfer a human wireframe or image data. The data is transferred by the communications interface 20H11 and either processed by the processor 20H08 immediately after image capture or stored in memory 20H10 for later use, or both. The processor 20H08 also receives information regarding the display's 20H22 attributes, and can calculate the orientation of the device, e.g., using information from an accelerometer 20H14 and/or other external data such as compass headings from a compass 20H18, or GPS location from a GPS chip 20H20, and the processor then uses the information to determine an orientation in which to display the image depending upon the example.

The captured image can be drawn by the processor 20H08, by a graphics accelerator 20H12, or by a combination of the two. In some embodiments, the processor can be the graphics accelerator 20H12. The image can first be drawn in memory 20H10 or, if available, the memory directly associated with the graphics accelerator 20H12. The methods described herein can be implemented by the processor 20H08, the graphics accelerator 20H12, or a combination of the two to create the image and related wireframe. Once the image or wireframe is drawn in memory, it can be displayed on the display 20H22.

FIG. 20I is a diagram of a smart phone system diagram according to an embodiment of the present disclosure. Computer system 20I00 is an example of computer hardware, software, and firmware that can be used to implement the disclosures above. System 20I00 includes a processor 20I26, which is representative of any number of physically and/or logically distinct resources capable of executing software, firmware, and hardware configured to perform identified computations. Processor 20I26 communicates with a chipset 20I28 that can control input to and output from processor 20I26. In this example, chipset 20I28 outputs information to display 20I42 and can read and write information to non-volatile storage 20I44, which can include magnetic media and solid state media, for example. Chipset 20I28 also can read data from and write data to RAM 20I46. A bridge 20I32 for interfacing with a variety of user interface components can be provided for interfacing with chipset 20I28. Such user interface components can include a keyboard 20I34, a microphone 20I36, touch-detection-and-processing circuitry 20I38, a pointing device such as a mouse 20I40, and so on. In general, inputs to system 20I00 can come from any of a variety of machine-generated and/or human-generated sources.

Chipset 20I28 also can interface with one or more data network interfaces 20I30 that can have different physical interfaces. Such data network interfaces 20I30 can include interfaces for wired and wireless local area networks, for broadband wireless networks, as well as personal area networks. Some applications of the methods for generating and displaying and using the GUI disclosed herein can include receiving data over a physical interface 20I31 or be generated by the machine itself by a processor 20I26 analyzing data stored in memory 20I10 or 20I46. Further, the machine can receive inputs from a user via a devices keyboard 20I34, microphone 20I36, touch device 20I38, and pointing device 20I40 and execute appropriate functions, such as browsing functions by interpreting these inputs using processor 20I26.

In embodiments where the invention is used in a display system, specific color properties of the emitted light may be desirable. For example, it may be desirable that the emitted light have a large color gamut. One known way to measure color gamut in display applications is by a comparison to the NTSC gamut. In some embodiments, the gamut is 50%, 70%, 90% or 100% of the NTSC gamut. In some embodiments, the gamut is less than 50%, less than 70%, less than 90%, and in some embodiments, less than 100% of the NTSC gamut.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof

What is claimed is:

1. A light source comprising: an LED die, wherein said LED die has a footprint with an area less than 250 μm×250 μm, and wherein said LED die comprises at least,
a semiconductor having bulk GaN substrate and an active region defining alight-emitting region;
at least one p-contact electrode disposed on one side of said semiconductor; and
an n-contact electrode having a first surface facing said semiconductor and a second surface facing away from said semiconductor, wherein said first surface is less than 20% of said area.

2. The light source of claim 1, wherein said LED die has a-flip-chip configuration.

3. The light source of claim 1, wherein said p-contact is disposed on one side of the semiconductor, and said n-contact is disposed on the opposite side of said semiconductor.

4. The light source of claim 1, wherein said area is less than 50×50 um^2.

5. The light source of claim 1, wherein said LED die further comprises sidewalls that are passivated.

6. The light source of claim 5, wherein said sidewalls are passivated by a dielectric layer.

7. The light source of claim 1, wherein said LED die is configured to operate at a current density higher than 100 A·cm−2.

8. The light source of claim 1, wherein bulk GaN substrate has a thickness of at least 50 nm.

9. The light source of claim 1, wherein said n-contact is disposed on the same side of said semiconductor light-emitting region as said p-contact.

10. A light source comprising: an LED die, wherein said LED die has a footprint with an area less than 250 μm×250 μm, and wherein said LED die comprises at least,
a semiconductor having a light-emitting region;
at least one p-contact electrode disposed on one side of said semiconductor; and
an n-contact electrode having a first surface facing said semiconductor and a second surface facing away from said semiconductor, wherein said first surface is less than 20% of said area, wherein said first surface is smaller than said second surface.

11. The light source of claim 10, wherein said first surface is no more than 1/5 of said second surface.

12. The light source of claim 10, wherein said n-contact is disposed on the same side of said semiconductor as said p-contact.

13. The light source of claim 12, wherein a portion of said n-contact underlays at least a portion of said p-contact.

14. The light source of claim 13, wherein a dielectric is disposed between said portion of said n-contact and said at least a portion of said p-contact.

15. The light source of claim 14, wherein the n-electrode extends beyond said base for contacting.

16. The light source of claim 10, wherein said LED die further comprises a substrate comprising bulk GaN.

17. The light source of claim 10, wherein said LED die has a flip-chip configuration.

18. The light source of claim 10, wherein said p-contact is disposed on one side of the semiconductor, and said n-contact is disposed on the opposite side of said semiconductor.

19. The light source of claim 10, wherein said area is less than 50×50 um^2.

20. The light source of claim 10, wherein said LED die further comprises sidewalls that are passivated.

* * * * *